(12) United States Patent
Adamchuk et al.

(10) Patent No.: US 12,173,201 B2
(45) Date of Patent: Dec. 24, 2024

(54) COPPER-CLAD LAMINATE AND METHOD OF FORMING THE SAME

(71) Applicant: VERSIV COMPOSITES LIMITED, Kilrush (IE)

(72) Inventors: Jennifer Adamchuk, Marlborough, MA (US); Dale Thomas, Rochdale (GB); Meghann White, Bedford, NH (US); Sethumadhavan Ravichandran, Shrewsbury, MA (US); Gerard T. Buss, Bedford, NH (US)

(73) Assignee: VERSIV COMPOSITES LIMITED, Kilrush (IE)

( * ) Notice: Subject to any disclaimer, the term of this patent is extended or adjusted under 35 U.S.C. 154(b) by 12 days.

(21) Appl. No.: 17/643,452

(22) Filed: Dec. 9, 2021

(65) Prior Publication Data
US 2022/0195253 A1 Jun. 23, 2022

Related U.S. Application Data

(60) Provisional application No. 63/126,111, filed on Dec. 16, 2020.

(51) Int. Cl.
*C09J 7/29* (2018.01)
*C09J 7/38* (2018.01)
(Continued)

(52) U.S. Cl.
CPC ............... *C09J 7/29* (2018.01); *C09J 7/381* (2018.01); *C09J 11/04* (2013.01); *H05K 1/0373* (2013.01);
(Continued)

(58) Field of Classification Search
CPC ..... B32B 27/322; C09J 127/12; C09J 127/18; C09J 127/20; C09J 2203/326; H05K 1/034; H05K 1/0373
See application file for complete search history.

(56) References Cited

U.S. PATENT DOCUMENTS

| 4,335,180 A | 6/1982 | Traut |
| 4,634,631 A | 1/1987 | Gazit et al. |

(Continued)

FOREIGN PATENT DOCUMENTS

| CN | 101365294 B | 6/2010 |
| CN | 102471590 B | 5/2012 |

(Continued)

OTHER PUBLICATIONS

International Search Report and Written Opinion for PCT Application No. PCT/US2021/072819, dated Mar. 31, 2022, 9 pages.
(Continued)

*Primary Examiner* — Zachary M Davis
(74) *Attorney, Agent, or Firm* — CANTOR COLBURN LLP

(57) ABSTRACT

The present disclosure relates to a copper-clad laminate that may include a copper foil layer, a fluoropolymer based adhesive layer overlying the copper foil layer, and a dielectric coating overlying the fluoropolymer based adhesive layer. The dielectric coating may include a resin matrix component, and a ceramic filler component. The ceramic filler component may include a first filler material. The dielectric coating may have an average thickness of not greater than about 20 microns.

20 Claims, 4 Drawing Sheets

(51) Int. Cl.
  *C09J 11/04* (2006.01)
  *H05K 1/03* (2006.01)
  *H05K 1/09* (2006.01)
  *H05K 3/46* (2006.01)
(52) U.S. Cl.
  CPC ............. *H05K 1/09* (2013.01); *H05K 3/4644* (2013.01); *C09J 2203/326* (2013.01); *C09J 2301/41* (2020.08); *C09J 2400/166* (2013.01); *C09J 2427/00* (2013.01); *C09J 2427/006* (2013.01); *H05K 2201/015* (2013.01); *H05K 2201/0209* (2013.01)

(56) References Cited

U.S. PATENT DOCUMENTS

| | | |
|---|---|---|
| 4,647,508 A | 3/1987 | Gazit et al. |
| 4,661,301 A | 4/1987 | Okada et al. |
| 4,784,901 A | 11/1988 | Hatakeyama et al. |
| 4,849,284 A | 7/1989 | Arthur et al. |
| 4,869,956 A | 9/1989 | Bridges et al. |
| 4,987,274 A | 1/1991 | Miller et al. |
| 5,055,342 A | 10/1991 | Markovich et al. |
| 5,061,548 A | 10/1991 | Arthur et al. |
| 5,075,065 A | 12/1991 | Effenberger et al. |
| 5,194,326 A | 3/1993 | Arthur et al. |
| 5,281,466 A | 1/1994 | Arthur et al. |
| 5,312,576 A | 5/1994 | Swei et al. |
| 5,354,611 A | 10/1994 | Arthur et al. |
| 5,374,453 A | 12/1994 | Swei et al. |
| 5,384,181 A | 1/1995 | Arthur et al. |
| 5,440,805 A | 8/1995 | Daigle et al. |
| 5,506,049 A | 4/1996 | Swei et al. |
| 5,607,744 A | 3/1997 | Diener et al. |
| 5,879,794 A | 3/1999 | Korleski, Jr. |
| 5,889,104 A | 3/1999 | Rosenmayer |
| 5,922,453 A | 7/1999 | Horn, III et al. |
| 6,172,139 B1 | 1/2001 | Swei et al. |
| 6,373,717 B1 | 4/2002 | Downes, Jr. et al. |
| 6,500,529 B1 | 12/2002 | McCarthy et al. |
| 7,981,504 B2 | 7/2011 | Nelson |
| 8,187,696 B2 | 5/2012 | Paul et al. |
| 8,314,005 B2 | 11/2012 | Purushothaman et al. |
| 8,530,746 B2 | 9/2013 | Zheng et al. |
| 8,652,641 B2 | 2/2014 | Wang et al. |
| 8,835,770 B2 | 9/2014 | Oyama et al. |
| 9,258,892 B2 | 2/2016 | Crosley |
| 9,462,688 B2 | 10/2016 | Park et al. |
| 9,962,907 B2 | 5/2018 | Price et al. |
| 10,096,398 B2 | 10/2018 | Janah et al. |
| 10,164,326 B2 | 12/2018 | Urcia et al. |
| 10,194,528 B2 | 1/2019 | Su |
| 10,236,092 B2 | 3/2019 | Restuccia et al. |
| 11,549,035 B2 | 1/2023 | Adamchuk et al. |
| 2004/0109298 A1 | 6/2004 | Hartman et al. |
| 2005/0244662 A1 | 11/2005 | Horn, III et al. |
| 2006/0062976 A1 | 3/2006 | Sohn et al. |
| 2006/0180936 A1 | 8/2006 | Japp et al. |
| 2007/0206364 A1 | 9/2007 | Swei et al. |
| 2009/0038828 A1 | 2/2009 | Hou et al. |
| 2009/0128912 A1 | 5/2009 | Okada et al. |
| 2010/0000771 A1* | 1/2010 | Shimauchi ............. H05K 3/386 442/232 |
| 2010/0015404 A1 | 1/2010 | Paul et al. |
| 2012/0069288 A1 | 3/2012 | Das et al. |
| 2012/0123021 A1 | 5/2012 | Yano et al. |
| 2012/0189826 A1 | 7/2012 | Hayashi |
| 2013/0163253 A1 | 6/2013 | Saito et al. |
| 2014/0170409 A1 | 6/2014 | Blackman et al. |
| 2015/0030824 A1 | 1/2015 | Crosley |
| 2015/0195921 A1 | 7/2015 | Onodera et al. |
| 2015/0366056 A1 | 12/2015 | Matsuda |
| 2016/0007452 A1 | 1/2016 | Yan et al. |
| 2016/0113113 A1 | 4/2016 | Sethumadhavan et al. |
| 2016/0242274 A1 | 8/2016 | Hosoda et al. |
| 2016/0280979 A1 | 9/2016 | Uchiyama et al. |
| 2017/0145182 A1 | 5/2017 | Horn, III et al. |
| 2017/0273188 A1 | 9/2017 | Su |
| 2018/0019177 A1 | 1/2018 | Harada et al. |
| 2018/0052488 A1 | 2/2018 | Posner et al. |
| 2018/0339493 A1 | 11/2018 | Chen et al. |
| 2019/0104612 A1 | 4/2019 | Amla |
| 2019/0136109 A1 | 5/2019 | Agapov et al. |
| 2019/0215957 A1 | 7/2019 | Kaimori et al. |
| 2020/0008298 A1 | 1/2020 | Yoneda et al. |
| 2020/0053877 A1 | 2/2020 | Liu et al. |
| 2020/0270413 A1 | 8/2020 | Koes et al. |
| 2020/0307162 A1 | 10/2020 | Remy et al. |
| 2020/0323078 A1 | 10/2020 | Tosaka et al. |
| 2020/0329558 A1 | 10/2020 | Kasai et al. |
| 2020/0404782 A1 | 12/2020 | Chen et al. |
| 2020/0413536 A1 | 12/2020 | Amla et al. |
| 2021/0059048 A1 | 2/2021 | Wang et al. |
| 2021/0060900 A1 | 3/2021 | Huang et al. |
| 2021/0101366 A1 | 4/2021 | Nagata et al. |
| 2022/0033617 A1 | 2/2022 | Adamchuk et al. |
| 2022/0039254 A1 | 2/2022 | Adamchuk et al. |
| 2022/0039256 A1 | 2/2022 | Adamchuk et al. |
| 2022/0186081 A1 | 6/2022 | Adamchuk et al. |
| 2022/0186082 A1 | 6/2022 | Adamchuk et al. |
| 2023/0191750 A1 | 6/2023 | Adamchuk et al. |
| 2023/0191761 A1 | 6/2023 | Adamchuk et al. |

FOREIGN PATENT DOCUMENTS

| | | |
|---|---|---|
| CN | 102719043 A | 10/2012 |
| CN | 101838431 B | 11/2012 |
| CN | 102275341 B | 11/2013 |
| CN | 104053302 A | 9/2014 |
| CN | 104149420 A | 11/2014 |
| CN | 104476847 A | 4/2015 |
| CN | 105453705 A | 3/2016 |
| CN | 105802186 A | 7/2016 |
| CN | 105820481 A | 8/2016 |
| CN | 106188998 A | 12/2016 |
| CN | 106604536 A | 4/2017 |
| CN | 106671517 A | 5/2017 |
| CN | 106928744 A | 7/2017 |
| CN | 104647868 B | 9/2017 |
| CN | 107172819 A | 9/2017 |
| CN | 107177245 A | 9/2017 |
| CN | 107278031 A | 10/2017 |
| CN | 107493653 A | 12/2017 |
| CN | 107509308 A | 12/2017 |
| CN | 106009428 B | 2/2018 |
| CN | 107722518 A | 2/2018 |
| CN | 207083283 U | 3/2018 |
| CN | 106113802 B | 4/2018 |
| CN | 106313840 A | 4/2018 |
| CN | 108456387 A | 8/2018 |
| CN | 106633180 A | 10/2018 |
| CN | 107474312 B | 2/2019 |
| CN | 106800733 B | 4/2019 |
| CN | 112519357 A | 3/2021 |
| EP | 0211979 A1 | 3/1987 |
| EP | 0279769 A2 | 8/1988 |
| EP | 0442363 A1 | 8/1991 |
| EP | 0769788 A2 | 4/1997 |
| EP | 1529812 A1 | 5/2005 |
| EP | 2179631 A2 | 4/2010 |
| EP | 2706088 A1 | 3/2014 |
| EP | 3028851 A1 | 6/2016 |
| EP | 3162561 A1 | 5/2017 |
| EP | 3546509 A1 | 10/2019 |
| JP | H0349291 A | 3/1991 |
| JP | H08153940 A | 6/1996 |
| JP | 10017838 A | 1/1998 |
| JP | 2890747 B2 | 5/1999 |
| JP | 2002151844 A | 5/2002 |
| JP | 2005001274 A | 1/2005 |
| JP | 2007098692 A | 4/2007 |
| JP | 4129627 B2 | 8/2008 |
| JP | 2009152489 A | 7/2009 |
| JP | 4598408 B2 | 12/2010 |

(56) References Cited

FOREIGN PATENT DOCUMENTS

| | | |
|---|---|---|
| JP | 4815209 B2 | 11/2011 |
| JP | 2012184422 A | 9/2012 |
| JP | 2015111625 A | 6/2015 |
| JP | 2016003260 A | 1/2016 |
| JP | 2016020488 A | 2/2016 |
| JP | 2016046433 A | 4/2016 |
| JP | 2016102563 A | 6/2016 |
| JP | 2018039260 A | 3/2018 |
| JP | 6564517 B1 | 8/2019 |
| KR | 20050090560 A | 9/2005 |
| KR | 20060027666 A | 3/2006 |
| KR | 20060127172 A | 12/2006 |
| KR | 100823998 B1 | 4/2008 |
| KR | 20130074955 A | 7/2013 |
| KR | 20150006713 A | 1/2015 |
| KR | 20150113050 A | 10/2015 |
| KR | 101775287 B1 | 9/2017 |
| KR | 20170101885 A | 9/2017 |
| KR | 20170134610 A | 12/2017 |
| TW | 268859 B | 12/2006 |
| TW | 590722 | 7/2017 |
| TW | 201922905 A | 6/2019 |
| TW | 202100354 A | 1/2021 |
| WO | 9609339 A1 | 3/1996 |
| WO | 9845880 A1 | 10/1998 |
| WO | 2006078889 A2 | 7/2006 |
| WO | 2008004399 A2 | 1/2008 |
| WO | 2015182696 A1 | 12/2015 |
| WO | 2016104297 A1 | 6/2016 |
| WO | 2016201076 A1 | 12/2016 |
| WO | 2020091026 A1 | 5/2020 |
| WO | 20158604 A1 | 12/2021 |
| WO | 2022026989 A1 | 2/2022 |
| WO | 2022026990 A1 | 2/2022 |
| WO | 2022026991 A1 | 2/2022 |
| WO | 2022133402 A1 | 6/2022 |
| WO | 2022133403 A1 | 6/2022 |
| WO | 2022133404 A1 | 6/2022 |
| WO | 2023114838 A1 | 6/2023 |
| WO | 2023114843 A1 | 6/2023 |

OTHER PUBLICATIONS

International Search Report and Written Opinion for PCT Application No. PCT/US2021/072820, dated Mar. 31, 2022, 10 pages.
International Search Report and Written Opinion for PCT Application No. PCT/US2021/072822, dated Apr. 5, 2022, 10 pages.
International Search Report and Written Opinion for PCT Application No. PCT/US2021/070953, dated Nov. 16, 2021, 9 pages.
International Search Report and Written Opinion for PCT Application No. PCT/US2021/070954, dated Nov. 16, 2021, 9 pages.
International Search Report and Written Opinion for PCT Application No. PCT/US2021/070955, dated Nov. 16, 2021, 9 pages.
Jawitz, M.W. et al., "Chapter 6: High-Speed/High-Frequency Laminates," In Materials for Rigid and Flexible Printed Wiring Boards, First Edition. CRC Press: New York, NY, pp. 113-131, dated 2006.
Murali, K.P. et al., "Preparation and properties of silica filled PTFE flexible laminates for microwave circuit applications," Elsevier, Composites: Part A, vol. 40, pp. 1179-1185, dated 2009.
Ratheesh, R. et al., "Chapter 11: Polymer-Ceramic Composites for Microwave Applications," In Microwave Materials and Applications, First Edition. Sebastian, M. T.; Ubic, R.; Jantunen, H.; John Wiley & Sons: Chichester, UK; Hoboken, NJ, pp. 481-535, dated 2017.
Sebastian, Mailadil T. et al., "Polymer-Ceramic Composites of 0-3 Connectivity for Circuits in Electronics: A Review," International Journal of Applied Ceramic Technology, vol. 7, No. 4, pates 415-434, dated 2010.
Zhuravlev, L.T., "The Surface Chemistry of Amorphous Silica. Zhuravlev Model," Colloids and Surfaces, A: Physiochemical and Engineering Aspects, vol. 173, pp. 1-38, dated Feb. 21, 2000.
Tsai, I-Shou et al., "A Study on the Fabrication Parameters and Dielectric Properties of PTFE Composites Filled with Al2O3 and Si)2 Nanoparticles," Journal of Industrial Textiles, vol. 40, No. 4, Apr. 20, 2011, pp. 361-379.
Yuan, Y. et al., "TiO2 and SiO2 Filled PTFE Composites for Microwave Substrate Applications," Journal of Polymer Research, vol. 21, Jan. 31, 2014, 6 pages.
Han, Kunkun et al., "Effect of Filler Structure on the Dielectric and Thermal Properties of SiO2/PTFE Composites," Journal of Materials Science: Materials in Electronics, Apr. 25, 2020, 7 pages.
Yuan, Ying et al., "Effect of Sintering Temperature on the Crystallization Behavior and Properties of Silica Filled PTFE Composites," Journal of Materials Science: Materials in Electronics, vol. 27, Aug. 5, 2016, pp. 13288-13293.
Yuan, Ying et al., "Effects of Compound Coupling Agents on the Properties of PTFE/SiO2 Microwave Composites," Journal of Materials Science: Materials in Electronics, vol. 28, Oct. 25, 2016, pp. 3356-3363.
Jiang, Zehua et al., "Effects of Particle Size Distribution of Silica on Properties of PTFE/SiO2 Composites," Materials Research Express, vol. 5, Jun. 22, 2018, 10 pages.
Xiang, Pang et al., "Effects of SiO2 Content on the Properties of PTFE/SiO2 Composites," Piezoelectrics & Acoustooptics, vol. 34, No. 4, Aug. 2012, pp. 577-580.
Yong, Xiao et al., "Effects of TiO2 Content on the Properties of PTFE/TiO2 Microwave Dielectric Composites," Piezoelectrics & Acoustooptics, vol. 34, No. 5, Oct. 2012, pp. 768-771.
Fields, Jeffrey T. et al., "Fluoroalkylsilanes in Silica/Fluoropolymer Composites," Polymer Composites, vol. 17, No. 2, Apr. 1996, pp. 242-250.
Chen-Yang, Yui Whei et al., "High-Performance Circuit Boards Based on Mesoporous Silica Filled PTFE Composite Materials," Electrochemical and Solid-State Letters, vol. 8, No. 1, dated 2005, pp. F1-F4.
Yuan, Ying et al., "Influence of SiO2 Addition on Properties of PTFE/TiO2 Microwave Composites," Journal of Electronic Materials, vol. 47, No. 1, Oct. 4, 2017, pp. 633-640.
Yan, Xiangyu et al., "Influences of Sintering Process on the Properties of SiO2-TiO2/PTFE Composites," Piezoelectrics & Acoustooptics, vol. 36, No. 2, Apr. 2014, pp. 270-274.
Rajesh, S. et al., "Microwave Dielectric Properties of PTFE/Rutile Nanocomposites," Journal of Alloys and Compounds, vol. 477, dated 2009, pp. 677-682.
Zhang, Dong-na et al., "Preparation and Characterization of PTFE-g-GMA modified PTFE/SiO2 Organic-Inorganic Hybrids," Journal of Polymer Research 19:9873, Apr. 25, 2012, 10 pages.
Zhang, Yao et al., "Preparation and Mechanical Properties of SiO2/Polytetrafluoroethylene Composite Films," Acta Materiae Compositae Sinica, vol. 36, No. 3, Mar. 2019, pp. 624-629.
Chen, Yung-Chih et al., "Preparation and properties of Silyated PTFE/SiO2 Organic-Inorganic Hybrids via Sol-Gel Process," Journal of Polymer Science: Part A: Polymer Chemistry, vol. 42, dated 2004, pp. 1789-1807.
Rajesh, S. et al., "Rutile Filled PTFE Composites for Flexible Microwave Substrate Applications," Materials Science and Engineering B, vol. 163, dated 2007, 7 pages.
Huang, Shi-Ing et al., "Study on the Composites of Two Sized Silica Filled in PTFE," Journal of Reinforced Plastics and Composites, vol. 25, No. 10, dated 2006, pp. 1053-1058.
Rajesh S. et al., "Temperature Stable Low Loss PTFE/Rutile Composites Using Secondary Polymer," Applied Physics A, Material Science & Processing, vol. 104, Nov. 4, 2010, pp. 159-164.
Chen, Yung-Chih et al., "The Effects of Filler Content and Size on the Properties of PTFE/SiO2 Composites," Journal of Polymer Research, vol. 10, dated 2003, pp. 247-258.
Chen, Yung-Chih et al., "The Effects of Phenyltrimethoxysilane Coupling Agents on the Properties of PTFE/Silica Composites," Journal of Polumer Research, vol. 11, dated 2004, pp. 1-7.
Luo, Fuchuan et al., "The Effects of TiO2 Particle Size on the Properties of PTFE/TiO2 Composites," Journal of Materials Science and Chemical Engineering, vol. 5, dated 2017, pp. 53-60.

(56) References Cited

OTHER PUBLICATIONS

Tsai, I-Shou et al., "The Study of the Low K of PTFE Composites with Hollow Glass Spheres," Journal of Industrial Textiles, vol. 40, No. 3, Jan. 2011, pp. 261-280.
International Search Report and Written Opinion for PCT Application No. PCT/US2022/081548, dated Apr. 18, 2023, 9 pages.
International Search Report and Written Opinion for PCT Application No. PCT/US2022/081554, dated Apr. 26, 2023, 9 pages.
Japanese Office Action for Japanese Application No. 2023-533278; dated Apr. 22, 2024; 3 pages.
Bhattacharjee, Sourav. DLS and zeta potential—What they are and what they are not? Journal of Controlled Release, vol. 235, 2016, pp. 337-351.
Extended European Search Report of the EPO issued Oct. 30, 2024 for corresponding European Application No. 21908006.6, 14 pages.

\* cited by examiner

COPPER-CLAD LAMINATE AND METHOD OF FORMING THE SAME

CROSS-REFERENCE TO RELATED APPLICATION(S)

This application claims priority under 35 U.S.C. § 119(e) to U.S. Provisional Patent Application No. 63/126,111, entitled "COPPER-CLAD LAMINATE AND METHOD OF FORMING THE SAME," by Jennifer ADAMCHUK et al., filed Dec. 16, 2020, which is assigned to the current assignee hereof and is incorporated by reference herein in its entirety.

FIELD OF THE DISCLOSURE

The present disclosure relates to a copper-clad laminate and methods of forming the same. In particular, the present disclosure related to a copper-clad laminate with a dielectric coating and methods of forming the same.

BACKGROUND

Copper-clad laminates (CCLs) include a dielectric material laminated onto or between two layers of conductive copper foil. Subsequent operations transform such CCLs into printed circuit boards (PCBs). When used to form PCBs, the conductive copper foil is selectively etched to form circuitry with through holes that are drilled between layers and metalized, i.e. plated, to establish conductivity between layers in multilayer PCBs. CCLs must therefore exhibit excellence thermomechanical stability. PCBs are also routinely exposed to excessively high temperatures during manufacturing operations, such as soldering, as well as in service. So, they must function at continuous temperatures above 200° C. without deforming and withstand dramatic temperature fluctuations while resisting moisture absorption. The dielectric layer of a CCL serves as a spacer between the conductive layers and can minimize electrical signal loss and crosstalk by blocking electrical conductivity. The lower the dielectric constant (permittivity) of the dielectric layer, the higher the speed of the electrical signal through the layer. A low dissipation factor, which is dependent upon temperature and frequency, as well as the polarizability of the material, is therefore very critical for high-frequency applications. Accordingly, improved dielectric materials and dielectric layers that can be used in PCBs and other high-frequency applications are desired.

SUMMARY

According to a first aspect, a copper-clad laminate may include a copper foil layer, a fluoropolymer based adhesive layer overlying the copper foil layer, and a dielectric coating overlying the fluoropolymer based adhesive layer. The dielectric coating may include a resin matrix component, and a ceramic filler component. The ceramic filler component may include a first filler material. The dielectric coating may have an average thickness of not greater than about 20 microns.

According to another aspect, a copper-clad laminate may include a copper foil layer, a fluoropolymer based adhesive layer overlying the copper foil layer, and a dielectric coating overlying the fluoropolymer based adhesive layer. The dielectric coating may include a resin matrix component, and a ceramic filler component. The ceramic filler component may include a first filler material. The particle size distribution of the first filler material may have a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

According to yet another aspect, a copper-clad laminate may include a copper foil layer, a fluoropolymer based adhesive layer overlying the copper foil layer, and a dielectric coating overlying the fluoropolymer based adhesive layer. The dielectric coating may include a resin matrix component, and a ceramic filler component. The ceramic filler component may include a first filler material. The first filler material may further have a mean particle size of not greater than about 5 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

According to another aspect, a printed circuit board may include a copper-clad laminate. The copper-clad laminate may include a copper foil layer, a fluoropolymer based adhesive layer overlying the copper foil layer, and a dielectric coating overlying the fluoropolymer based adhesive layer. The dielectric coating may include a resin matrix component, and a ceramic filler component. The ceramic filler component may include a first filler material. The dielectric coating may have an average thickness of not greater than about 20 microns.

According to still another aspect, a printed circuit board may include a copper-clad laminate. The copper-clad laminate may include a copper foil layer, a fluoropolymer based adhesive layer overlying the copper foil layer, and a dielectric coating overlying the fluoropolymer based adhesive layer. The dielectric coating may include a resin matrix component, and a ceramic filler component. The ceramic filler component may include a first filler material. The particle size distribution of the first filler material may have a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

According to another aspect, a printed circuit board may include a copper-clad laminate. The copper-clad laminate may include a copper foil layer, a fluoropolymer based adhesive layer overlying the copper foil layer, and a dielectric coating overlying the fluoropolymer based adhesive layer. The dielectric coating may include a resin matrix component, and a ceramic filler component. The ceramic filler component may include a first filler material. The first filler material may further have a mean particle size of not greater than about 5 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

According to another aspect, a method of forming a copper-clad laminate may include providing a copper foil layer, applying a fluoropolymer based adhesive layer overlying the copper foil layer, combining a resin matrix precursor component and a ceramic filler precursor component to form a forming mixture, and forming the forming mixture into a dielectric coating overlying the fluoropolymer based adhesive layer. The ceramic filler precursor component may include a first filler precursor material. The dielectric coating may have an average thickness of not greater than about 20 microns.

According to yet another aspect, a method of forming a copper-clad laminate may include providing a copper foil layer, applying a fluoropolymer based adhesive layer overlying the copper foil layer, combining a resin matrix precursor component and a ceramic filler precursor component to form a forming mixture, and forming the forming mixture into a dielectric coating overlying the fluoropolymer based adhesive layer. The ceramic filler precursor component may include a first filler precursor material. The particle size distribution of the first filler material may have a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

According to another aspect, a method of forming a copper-clad laminate may include providing a copper foil layer, applying a fluoropolymer based adhesive layer overlying the copper foil layer, combining a resin matrix precursor component and a ceramic filler precursor component to form a forming mixture, and forming the forming mixture into a dielectric coating overlying the fluoropolymer based adhesive layer. The ceramic filler precursor component may include a first filler precursor material. The first filler precursor material may further have a mean particle size of not greater than about 5 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

According to another aspect, a method of forming a printed circuit board may include providing a copper foil layer, applying a fluoropolymer based adhesive layer overlying the copper foil layer, combining a resin matrix precursor component and a ceramic filler precursor component to form a forming mixture, and forming the forming mixture into a dielectric coating overlying the fluoropolymer based adhesive layer. The ceramic filler precursor component may include a first filler precursor material. The dielectric coating may have an average thickness of not greater than about 20 microns.

According to yet another aspect, a method of forming a printed circuit board may include providing a copper foil layer, applying a fluoropolymer based adhesive layer overlying the copper foil layer, combining a resin matrix precursor component and a ceramic filler precursor component to form a forming mixture, and forming the forming mixture into a dielectric coating overlying the fluoropolymer based adhesive layer. The ceramic filler precursor component may include a first filler precursor material. The particle size distribution of the first filler material may have a $D_{10}$ of at least about 0.2 microns and not greater than about 1.6, a $D_{50}$ of at least about 0.5 microns and not greater than about 2.7 microns, and a $D_{90}$ of at least about 0.8 microns and not greater than about 4.7 microns.

According to another aspect, a method of forming a printed circuit board may include providing a copper foil layer, applying a fluoropolymer based adhesive layer overlying the copper foil layer, combining a resin matrix precursor component and a ceramic filler precursor component to form a forming mixture, and forming the forming mixture into a dielectric coating overlying the fluoropolymer based adhesive layer. The ceramic filler precursor component may include a first filler precursor material. The first filler precursor material may further have a mean particle size of not greater than about 5 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

BRIEF DESCRIPTION OF THE DRAWINGS

Embodiments are illustrated by way of example and are not limited to the accompanying figures.

Skilled artisans appreciate that elements in the figures are illustrated for simplicity and clarity and have not necessarily been drawn to scale.

DETAILED DESCRIPTION

The following discussion will focus on specific implementations and embodiments of the teachings. The detailed description is provided to assist in describing certain embodiments and should not be interpreted as a limitation on the scope or applicability of the disclosure or teachings. It will be appreciated that other embodiments can be used based on the disclosure and teachings as provided herein.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Embodiments described herein are generally directed to a copper-clad laminates that may include a copper foil layer, a fluoropolymer based adhesive layer overlying the copper foil layer, and a dielectric coating overlying the fluoropolymer based adhesive layer. According to certain embodiments, the dielectric coating may include a resin matrix component, and a ceramic filler component.

Figure 1:
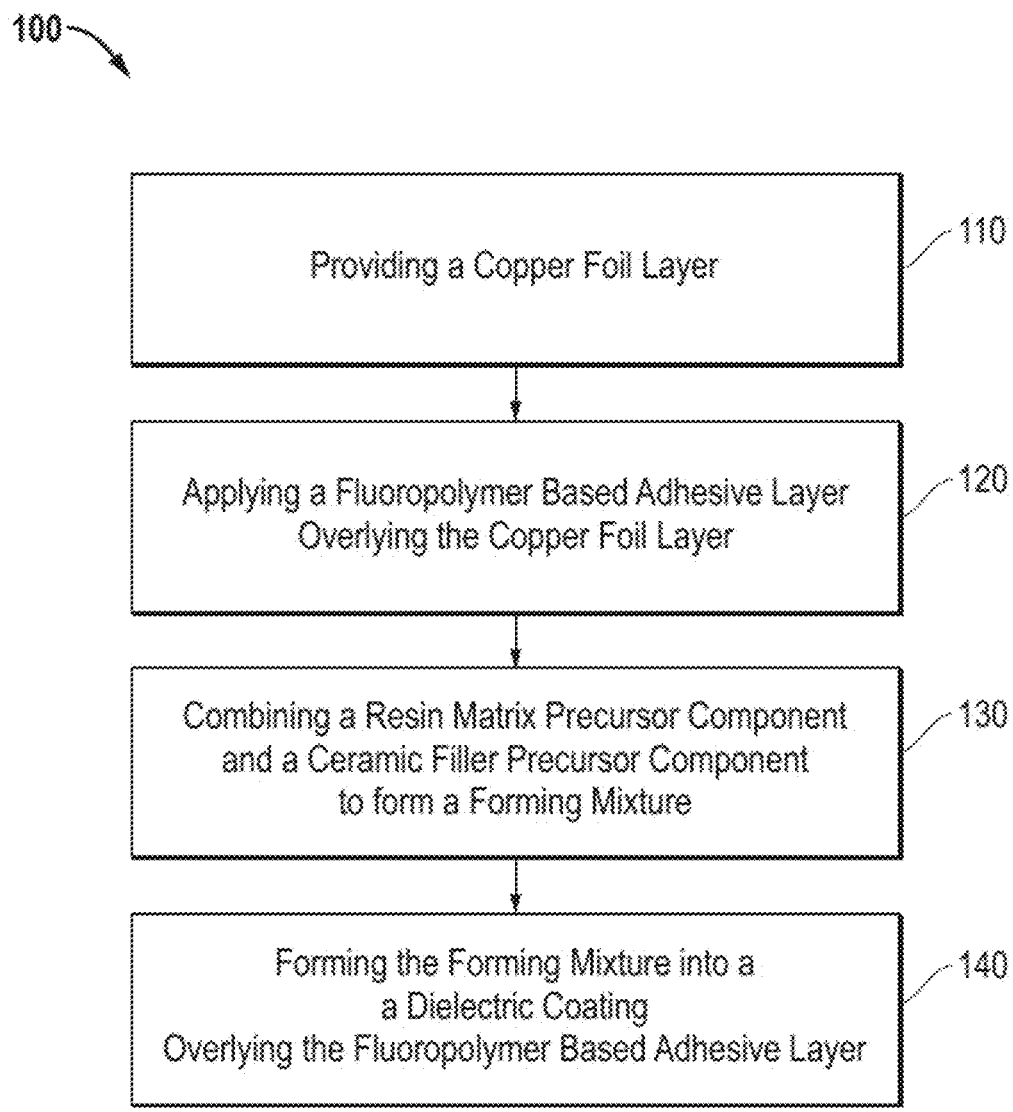
FIG. 1 includes a diagram showing a copper-clad laminate forming method according to embodiments described herein.

Referring first to a method of forming a copper-clad laminate, FIG. 1 includes a diagram showing a forming method 100 for forming a copper-clad laminate according to embodiments described herein. According to particular embodiments, the forming method 100 may include a first step 110 of providing a copper foil layer, a second step 120 of applying a fluoropolymer based adhesive layer overlying the copper foil layer, a third step 130 of combining a resin matrix precursor component and a ceramic filler precursor component to form a forming mixture, and a fourth step 140 of forming the forming mixture into a dielectric coating overlying the fluoropolymer based adhesive layer.

According to still other embodiments, the fluoropolymer based adhesive layer may have a particular average thickness. For example, the fluoropolymer based adhesive layer may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the fluoropolymer based adhesive layer may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the fluoropolymer based adhesive layer may be any value between, and including, any of the minimum and maximum values noted above. It will be further appreciated that the average thickness of the fluoropolymer based adhesive layer may be within a range between, and including, any of the minimum and maximum values noted above.

According to still other embodiments, the fluoropolymer based adhesive layer may include a particular material. For example, the fluoropolymer based adhesive layer may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the ceramic filler precursor component may include a first filler precursor material, which may have particular characteristics that may improve performance of the copper-clad laminate formed by the forming method 100.

According to certain embodiments, the first filler precursor material may have a particular size distribution. For purposes of embodiments described herein, the particle size distribution of a material, for example, the particle size distribution of a first filler precursor material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler precursor material may have a particular size distribution $D_{10}$ value. For example, the $D_{10}$ of the first filler precursor material may be at least about 0.2 microns, such as, at least about 0.3 or at least about 0.4 or at least about 0.5 or at least about 0.6 microns or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler precursor material may be any value between, and including, any of the minimum and maximum values noted above. It will be further appreciated that the $D_{10}$ of the first filler precursor material may be within a range between, and including, any of the minimum and maximum values noted above.

According to other embodiments, the first filler precursor material may have a particular size distribution $D_{50}$ value. For example, the $D_{50}$ of the first filler precursor material may be at least about 0.5 microns, such as, at least about 0.6 or at least about 0.7 or at least about 0.8 or at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler precursor material may be any value between, and including, any of the minimum and maximum values noted above. It will be further appreciated that the $D_{50}$ of the first filler precursor material may be within a range between, and including, any of the minimum and maximum values noted above.

According to other embodiments, the first filler precursor material may have a particular size distribution $D_{90}$ value. For example, the $D_{90}$ of the first filler precursor material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler precursor material may be any value between, and including, any of the minimum and maximum values noted above. It will be further appreciated that the $D_{90}$ of the first filler precursor material may be within a range between, and including, any of the minimum and maximum values noted above.

According to still other embodiments, the first filler precursor material may have a particular mean particle size as measured using laser diffraction spectroscopy. For example, the mean particle size of the first filler precursor material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler precursor material may be any value between, and including, any of the values noted above. It will be further appreciated that the mean particle size of the first filler precursor material may be within a range between, and including, any of the values noted above.

According to still other embodiments, the first filler precursor material may be described as having a particular particle size distribution span (PSDS), where the PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material. For example, the PSDS of the first filler precursor material may be not greater than about 5, such as, not greater than about 4.5 or not greater than about 4.0 or not greater than about 3.5 or not greater than about 3.0 or even not greater than about 2.5. It will be appreciated that the PSDS of the first filler precursor material may be any value between, and including, any of the values noted above. It will be further appreciated that the PSDS of the first filler precursor material may be within a range between, and including, any of the values noted above.

According to still other embodiments, the first filler precursor material may be described as having a particular average surface area as measured using Brunauer-Emmett-Teller (BET) surface area analysis (Nitrogen Adsorption). For example, the first filler precursor material may have an average surface area of not greater than about 10 $m^2/g$, such as, not greater than about 9.9 $m^2/g$ or not greater than about 9.5 $m^2/g$ or not greater than about 9.0 $m^2/g$ or not greater than about 8.5 $m^2/g$ or not greater than about 8.0 $m^2/g$ or not greater than about 7.5 $m^2/g$ or not greater than about 7.0 $m^2/g$ or not greater than about 6.5 $m^2/g$ or not greater than about 6.0 $m^2/g$ or not greater than about 5.5 $m^2/g$ or not greater than about 5.0 $m^2/g$ or not greater than about 4.5 $m^2/g$ or not greater than about 4.0 $m^2/g$ or even not greater than about 3.5 $m^2/g$. According to still other embodiments, the first filler precursor material may have an average surface area of at least about 1.2 $m^2/g$, such as, at least about 2.2 $m^2/g$. It will be appreciated that the average surface area of the first filler precursor material may be any value between, and including, any of the minimum and maximum values noted above. It will be further appreciated that the average surface area of the first filler precursor material may be within a range between, and including, any of the minimum and maximum values noted above.

According to other embodiments, the first filler precursor material may include a particular material. According to particular embodiments, the first filler precursor material may include a silica based compound. According to still other embodiments, the first filler precursor material may consist of a silica based compound. According to other embodiments, the first filler precursor material may include silica. According to still other embodiments, the first filler precursor material may consist of silica.

According to yet other embodiments, the forming mixture may include a particular content of the ceramic filler precursor component. For example, the content of the ceramic filler precursor component may be at least about 30 vol. % for a total volume of the first forming mixture, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler precursor component may be not greater than about 57 vol. % for a total volume of the forming mixture, such as, not greater than about 56 vol. % or even not greater than about 55 vol. %. It will be appreciated that the content of the ceramic filler precursor component may be any value between, and including, any of the minimum and maximum values noted above. It will be further appreciated that the content of the ceramic filler precursor component may be within a range between, and including, any of the minimum and maximum values noted above.

According to still other embodiments, the ceramic filler precursor component may include a particular content of the first filler precursor material. For example, the content of the first filler precursor material may be at least about 80 vol. % for a total volume of the ceramic filler precursor component, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler precursor material may be not greater than about 100 vol. % for a total volume of the ceramic filler precursor component, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler precursor material may be any value between, and including, any of the minimum and maximum values noted above. It will be further appreciated that the content of the first filler precursor material may be within a range between, and including, any of the minimum and maximum values noted above.

According to still other embodiments, the ceramic filler precursor component may include a second filler precursor material.

According to yet other embodiments, the second filler precursor material may include a particular material. For example, the second filler precursor material may include a high dielectric constant ceramic material, such as, a ceramic material having a dielectric constant of at least about 14. According to particular embodiments, the second filler precursor material may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler precursor material may include $TiO_2$. According to still other embodiments, the second filler precursor material may consist of $TiO_2$.

According to still other embodiments, the ceramic filler precursor component may include a particular content of the second filler precursor material. For example, the content of the second filler precursor material may be at least about 1 vol. % for a total volume of the ceramic filler precursor component, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler precursor material may be not greater than about 20 vol. % for a total volume of the ceramic filler precursor component, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler precursor material may be any value between, and including, any of the minimum and maximum values noted above. It will be further appreciated that the content of the second filler precursor material may be within a range between, and including, any of the minimum and maximum values noted above.

According to yet other embodiments, the ceramic filler precursor component may include a particular content of amorphous material. For example, the ceramic filler precursor component may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the resin matrix precursor component may include a particular material. For example, the resin matrix precursor component may include a perfluoropolymer. According to still other embodiments, the resin matrix precursor component may consist of a perfluoropolymer.

According to yet other embodiments, the perfluoropolymer of the resin matrix precursor component may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the resin matrix precursor component may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the resin matrix precursor component may include polytetrafluoroethylene (PTFE), perfluoroalkoxy polymer resin (PFA), fluorinated ethylene propylene (FEP), or any combination thereof. According to still other embodiments, the perfluoropolymer of the resin matrix precursor component may consist of polytetrafluoroethylene (PTFE), perfluoroalkoxy polymer resin (PFA), fluorinated ethylene propylene (FEP), or any combination thereof.

According to yet other embodiments, the forming mixture may include a particular content of the resin matrix precursor component. For example, the content of the resin matrix precursor component may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the resin matrix precursor component is not greater than about 63 vol. % for a total volume of the forming mixture or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the resin matrix precursor component may be any value between, and including, any of the minimum and maximum values noted above. It will be further appreciated that the content of the resin matrix precursor component may be within a range between, and including, any of the minimum and maximum values noted above.

According to yet other embodiments, the forming mixture may include a particular content of the perfluoropolymer. For example, the content of the perfluoropolymer may be at least about 45 vol. % for a total volume of the forming mixture, such as, at least about 46 vol. % or at least about 47 vol. % or at least about 48 vol. % or at least about 49 vol. % or at least about 50 vol. % or at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the forming mixture, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

Figure 2:
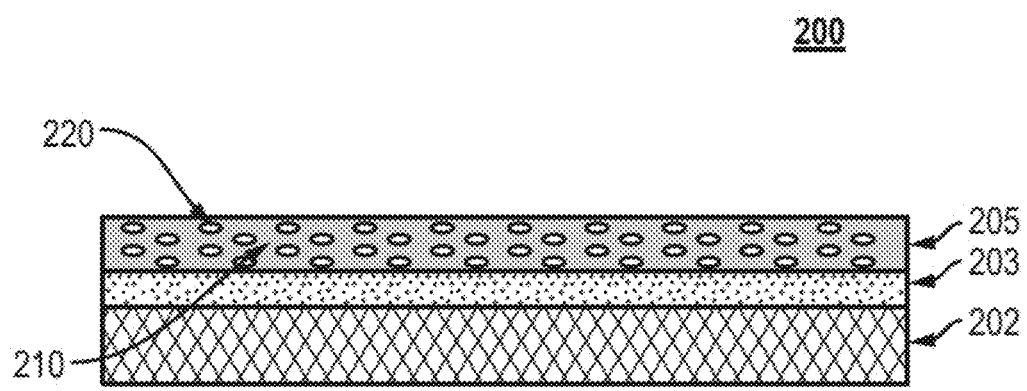
FIG. 2 includes an illustration showing the configuration of a copper-clad laminate formed according to embodiments described herein.

Referring now to embodiments of the copper-clad laminate formed according to forming method 100, FIG. 2 includes diagram of a copper-clad lamination 200. As shown in FIG. 2, the copper-clad laminate 200 may include a copper foil layer 202, a fluoropolymer based adhesive layer 203 overlying the copper foil layer 202, and a dielectric coating 205 overlying a surface of the fluoropolymer based adhesive layer 203. According to certain embodiments, the dielectric coating 205 may include a resin matrix component 210 and a ceramic filler component 220.

According to still other embodiments, the fluoropolymer based adhesive layer 203 may have a particular average thickness. For example, the fluoropolymer based adhesive layer 203 may be at least about 0.2 microns, such as, at least about 0.5 microns or at least about 1.0 microns or at least about 1.5 microns or at least about 2.0 microns or at least about 2.5 microns or even at least about 3.0 microns. According to yet other embodiments, the average thickness of the fluoropolymer based adhesive layer 203 may be not greater than about 7 microns, such as, not greater than about 6.5 or not greater than about 6.0 or not greater than about 5.5 or not greater than about 5.0 not greater than about 4.9 microns or not greater than about 4.8 microns or not greater than about 4.7 microns or not greater than about 4.6 microns or not greater than about 4.5 microns or not greater than about 4.4 microns or not greater than about 4.3 microns or not greater than about 4.2 microns or not greater than about 4.1 microns or not greater than about 4.1 microns or not greater than about 4.0 microns or not greater than about 3.9 microns or not greater than about 3.8 microns or not greater than about 3.7 microns or not greater than about 3.6 microns or even not greater than about 3.5 microns. It will be appreciated that the average thickness of the fluoropolymer based adhesive layer 203 may be any value between, and including, any of the minimum and maximum values noted above. It will be further appreciated that the average thickness of the fluoropolymer based adhesive layer 203 may be within a range between, and including, any of the minimum and maximum values noted above.

According to still other embodiments, the fluoropolymer based adhesive layer 203 may include a particular material. For example, the fluoropolymer based adhesive layer 203 may include fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof. According to still other embodiments, the fluoropolymer based adhesive layer may consist of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

According to particular embodiments, the ceramic filler component 220 may include a first filler material, which may have particular characteristics that may improve performance of the copper-clad laminate 200.

According to certain embodiments, the first filler material of the ceramic filler component 220 may have a particular size distribution. For purposes of embodiments described herein, the particle size distribution of a material, for example, the particle size distribution of a first filler material may be described using any combination of particle size distribution D-values $D_{10}$, $D_{50}$ and $D_{90}$. The $D_{10}$ value from a particle size distribution is defined as a particle size value where 10% of the particles are smaller than the value and 90% of the particles are larger than the value. The $D_{50}$ value from a particle size distribution is defined as a particle size value where 50% of the particles are smaller than the value and 50% of the particles are larger than the value. The $D_{90}$ value from a particle size distribution is defined as a particle size value where 90% of the particles are smaller than the value and 10% of the particles are larger than the value. For purposes of embodiments described herein, particle size measurements for a particular material are made using laser diffraction spectroscopy.

According to certain embodiments, the first filler material of the ceramic filler component 220 may have a particular size distribution $D_{10}$ value. For example, the $D_{10}$ of the first filler material may be at least about 0.2 microns, such as, at least about 0.3 or at least about 0.4 or at least about 0.5 or at least about 0.6 or at least about 0.7 microns or at least about 0.8 microns or at least about 0.9 microns or at least about 1.0 microns or at least about 1.1 microns or even at least about 1.2 microns. According to still other embodiments, the $D_{10}$ of the first filler material may be not greater than about 1.6 microns, such as, not greater than about 1.5 microns or even not greater than about 1.4 microns. It will be appreciated that the $D_{10}$ of the first filler material may be any value between, and including, any of the minimum and maximum values noted above. It will be further appreciated that the $D_{10}$ of the first filler material may be within a range between, and including, any of the minimum and maximum values noted above.

According to other embodiments, the first filler material of the ceramic filler component 420 may have a particular size distribution $D_{50}$ value. For example, the $D_{50}$ of the first filler material may be at least about 0.5 microns, such as, at least about 0.6 or at least about 0.7 or at least about 0.8 or at least about 0.9 microns or at least about 1.0 microns or at least about 1.1 microns or at least about 1.2 microns or at least about 1.3 microns or at least about 1.4 microns or at least about 1.5 microns or at least about 1.6 microns or at least about 1.7 microns or at least about 1.8 microns or at least about 1.9 microns or at least about 2.0 microns or at least about 2.1 microns or even at least about 2.2 microns. According to still other embodiments, the $D_{50}$ of the first filler material may be not greater than about 2.7 microns, such as, not greater than about 2.6 microns or not greater than about 2.5 microns or even not greater than about 2.4. It will be appreciated that the $D_{50}$ of the first filler material may be any value between, and including, any of the minimum and maximum values noted above. It will be further appreciated that the $D_{50}$ of the first filler material may be within a range between, and including, any of the minimum and maximum values noted above.

According to other embodiments, the first filler material of the ceramic filler component 220 may have a particular size distribution $D_{90}$ value. For example, the $D_{90}$ of the first filler material may be at least about 0.8 microns, such as, at least about 0.9 or at least about 1.0 or at least about 1.1 or at least about 1.2 or at least about 1.3 or at least about 1.4 or at least about 1.5 or at least about 1.6 microns or at least about 1.7 microns or at least about 1.8 microns or at least about 1.9 microns or at least about 2.0 microns or at least about 2.1 microns or at least about 2.2 microns or at least about 2.3 microns or at least about 2.4 microns or at least about 2.5 microns or at least about 2.6 microns or even at least about 2.7 microns. According to still other embodiments, the $D_{90}$ of the first filler material may be not greater than about 8.0 microns, such as, not greater than about 7.5 microns or not greater than about 7.0 microns or not greater than about 6.5 microns or not greater than about 6.0 microns or not greater than about 5.5 microns or not greater than about 5.4 microns or not greater than about 5.3 microns or not greater than about 5.2 or even not greater than about 5.1 microns. It will be appreciated that the $D_{90}$ of the first filler material may be any value between, and including, any of the minimum and maximum values noted above. It will be further appreciated that the $D_{90}$ of the first filler material may be within a range between, and including, any of the minimum and maximum values noted above.

According to still other embodiments, the first filler material of the ceramic filler component 220 may have a particular mean particle size as measured using laser diffraction spectroscopy. For example, the mean particle size of the first filler material may be not greater than about 10 microns, such as, not greater than about 9 microns or not greater than about 8 microns or not greater than about 7 microns or not greater than about 6 microns or not greater than about 5 microns or not greater than about 4 microns or not greater than about 3 microns or even not greater than about 2 microns. It will be appreciated that the mean particle size of the first filler material may be any value between, and including, any of the values noted above. It will be further appreciated that the mean particle size of the first filler material may be within a range between, and including, any of the values noted above.

According to still other embodiments, the first filler material of the ceramic filler component 220 may be described as having a particular particle size distribution span (PSDS), where the PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material. For example, the PSDS of the first filler material may be not greater than about 5, such as, not greater than about 4.5 or not greater than about 4.0 or not greater than about 3.5 or not greater than about 3.0 or even not greater than about 2.5. It will be appreciated that the PSDS of the first filler material may be any value between, and including, any of the values noted above. It will be further appreciated that the PSDS of the first filler material may be within a range between, and including, any of the values noted above.

According to still other embodiments, the first filler material of the ceramic filler component 220 may be described as having a particular average surface area as measured using Brunauer-Emmett-Teller (BET) surface area analysis (Nitrogen Adsorption). For example, the first filler material may have an average surface area of not greater than about 10 m$^2$/g, such as, not greater than about 9.9 m$^2$/g or not greater than about 9.5 m$^2$/g or not greater than about 9.0 m$^2$/g or not greater than about 8.5 m$^2$/g or not greater than about 8.0 m$^2$/g m$^2$/g or not greater than about 7.5 m$^2$/g or not greater than about 7.0 m$^2$/g or not greater than about 6.5 m$^2$/g or not greater than about 6.0 m$^2$/g or not greater than about 5.5 m$^2$/g or not greater than about 5.0 m$^2$/g or not greater than about 4.5 m$^2$/g or not greater than about 4.0 m$^2$/g or even not greater than about 3.5 m$^2$/g. According to still other embodiments, the first filler material may have an average surface area of at least about 1.2 m$^2$/g, such as, at least about 2.2 m$^2$/g. It will be appreciated that the average surface area of the first filler material may be any value between, and including, any of the minimum and maximum values noted above. It will be further appreciated that the average surface area of the first filler material may be within a range between, and including, any of the minimum and maximum values noted above.

According to other embodiments, the first filler material of the ceramic filler component 220 may include a particular material. According to particular embodiments, the first filler material may include a silica based compound. According to still other embodiments, the first filler material may consist of a silica based compound. According to other embodiments, the first filler material may include silica. According to still other embodiments, the first filler material may consist of silica.

According to yet other embodiments, the dielectric coating 205 may include a particular content of the ceramic filler component 220. For example, the content of the ceramic filler component 220 may be at least about 30 vol. % for a total volume of the dielectric coating 205, such as, at least about 31 vol. % or at least about 32 vol. % or at least about 33 vol. % or at least about 34 vol. % or at least about 35 vol. % or at least about 36 vol. % or at least about 37 vol. % or at least about 38 vol. % or at least about 39 vol. % or at least about 40 vol. % or at least about 41 vol. % or at least about 42 vol. % or at least about 43 vol. % or at least about 44 vol. % or at least about 45 vol. % or at least about 46 vol. % or at least about 47 vol. % or at least about 48 vol. % or at least about 49 vol. % or at least about 50 vol. % or at least about 51 vol. % or at least about 52 vol. % or at least about 53 vol. % or even at least about 54 vol. %. According to still other embodiments, the content of the ceramic filler component 220 may be not greater than about 57 vol. % for a total volume of the dielectric coating 400, such as, not greater than about 56 vol. % or even not greater than about 55 vol. %. It will be appreciated that the content of the ceramic filler component 220 may be any value between, and including, any of the minimum and maximum values noted above. It will be further appreciated that the content of the ceramic filler component 220 may be within a range between, and including, any of the minimum and maximum values noted above.

According to still other embodiments, the ceramic filler component 220 may include a particular content of the first filler material. For example, the content of the first filler material may be at least about 80 vol. % for a total volume of the ceramic filler component 220, such as, at least about 81 vol. % or at least about 82 vol. % or at least about 83 vol. % or at least about 84 vol. % or at least about 85 vol. % or at least about 86 vol. % or at least about 87 vol. % or at least about 88 vol. % or at least about 89 vol. % or even at least about 90 vol. %. According to still other embodiments, the content of the first filler material may be not greater than about 100 vol. % for a total volume of the ceramic filler component 220, such as, not greater than about 99 vol. % or not greater than about 98 vol. % or not greater than about 97 vol. % or not greater than about 96 vol. % or not greater than about 95 vol. % or not greater than about 94 vol. % or not greater than about 93 vol. % or even not greater than about 92 vol. %. It will be appreciated that the content of the first filler material may be any value between, and including, any of the minimum and maximum values noted above. It will be further appreciated that the content of the first filler material may be within a range between, and including, any of the minimum and maximum values noted above.

According to still other embodiments, the ceramic filler component 220 may include a second filler material.

According to yet other embodiments, the second filler material of the ceramic filler component 220 may include a particular material. For example, the second filler material may include a high dielectric constant ceramic material, such as, a ceramic material having a dielectric constant of at least about 14. According to particular embodiments, the second filler material of the ceramic filler component 220 may include any high dielectric constant ceramic material, such as, $TiO_2$, $SrTiO_3$, $ZrTi_2O_6$, $MgTiO_3$, $CaTiO_3$, $BaTiO_4$ or any combination thereof.

According to yet other embodiments, the second filler material of the ceramic filler component 220 may include $TiO_2$. According to still other embodiments, the second filler material may consist of $TiO_2$.

According to still other embodiments, the ceramic filler component 220 may include a particular content of the second filler material. For example, the content of the second filler material may be at least about 1 vol. % for a total volume of the ceramic filler component 220, such as, at least about 2 vol. % or at least about 3 vol. % or at least about 4 vol. % or at least about 5 vol. % or at least about 6 vol. % or at least about 7 vol. % or at least about 8 vol. % or at least about 9 vol. % or at least about 10 vol. %. According to still other embodiments, the content of the second filler material may be not greater than about 20 vol. % for a total volume of the ceramic filler component 220, such as, not greater than about 19 vol. % or not greater than about 18 vol. % or not greater than about 17 vol. % or not greater than about 16 vol. % or not greater than about 15 vol. % or not greater than about 14 vol. % or not greater than about 13 vol. % or not greater than about 12 vol. %. It will be appreciated that the content of the second filler material may be any value between, and including, any of the minimum and maximum values noted above. It will be further appreciated that the content of the second filler material may be within a range between, and including, any of the minimum and maximum values noted above.

According to yet other embodiments, the ceramic filler component 220 may include a particular content of amorphous material. For example, the ceramic filler component 220 may include at least about 97% amorphous material, such as, at least about 98% or even at least about 99%. It will be appreciated that the content of amorphous material may be any value between, and including, any of the values noted above. It will be further appreciated that the content of the content of amorphous material may be within a range between, and including, any of the values noted above.

According to other embodiments, the resin matrix component 210 may include a particular material. For example, the resin matrix component 210 may include a perfluoropolymer. According to still other embodiments, the resin matrix component 210 may consist of a perfluoropolymer.

According to yet other embodiments, the perfluoropolymer of the resin matrix component 210 may include a copolymer of tetrafluoroethylene (TFE); a copolymer of hexafluoropropylene (HFP); a terpolymer of tetrafluoroethylene (TFE); or any combination thereof. According to other embodiments, the perfluoropolymer of the resin matrix component 210 may consist of a copolymer of tetrafluoroethylene (TFE); a copolymer of hexafluoropropylene (HFP); a terpolymer of tetrafluoroethylene (TFE); or any combination thereof.

According to yet other embodiments, the perfluoropolymer of the resin matrix component 210 may include polytetrafluoroethylene (PTFE), perfluoroalkoxy polymer resin (PFA), fluorinated ethylene propylene (FEP), or any combination thereof. According to still other embodiments, the perfluoropolymer of the resin matrix component 210 may consist of polytetrafluoroethylene (PTFE), perfluoroalkoxy polymer resin (PFA), fluorinated ethylene propylene (FEP), or any combination thereof.

According to yet other embodiments, the dielectric coating 200 may include a particular content of the resin matrix component 210. For example, the content of the resin matrix component 210 may be at least about 50 vol. % for a total volume of the dielectric coating 200, such as, at least about 51 vol. % or at least about 52 vol. % or at least about 53 vol. % or at least about 54 vol. % or even at least about 55 vol. %. According to still other embodiments, the content of the resin matrix component 210 is not greater than about 63 vol. % for a total volume of the dielectric coating 200 or not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the resin matrix component 210 may be any value between, and including, any of the minimum and maximum values noted above. It will be further appreciated that the content of the resin matrix component 210 may be within a range between, and including, any of the minimum and maximum values noted above.

According to yet other embodiments, the dielectric coating 205 may include a particular content of the perfluoropolymer. For example, the content of the perfluoropolymer may be at least about 50 vol. % for a total volume of the dielectric coating 205, such as, at least about 51 vol. % or at least about 52 vol. % or at least about 53 vol. % or at least about 54 vol. % or even at least about 55 vol. %. According to still other embodiments, the content of the perfluoropolymer may be not greater than about 63 vol. % for a total volume of the dielectric coating 205, such as, not greater than about 62 vol. % or not greater than about 61 vol. % or not greater than about 60 vol. % or not greater than about 59 vol. % or not greater than about 58 vol. % or even not greater than about 57 vol. %. It will be appreciated that the content of the perfluoropolymer may be any value between, and including, any of the minimum and maximum values noted above. It will be further appreciated that the content of the perfluoropolymer may be within a range between, and including, any of the minimum and maximum values noted above.

According to still other embodiments, the dielectric coating 205 may include a particular porosity as measured using x-ray diffraction. For example, the porosity of the substrate 205 may be not greater than about 10 vol. %, such as, not greater than about 9 vol. % or not greater than about 8 vol. % or not greater than about 7 vol. % or not greater than about 6 vol. % or even not greater than about 5 vol. %. It will be appreciated that the porosity of the dielectric coating 205 may be any value between, and including, any of the values noted above. It will be further appreciated that the porosity of the dielectric coating 205 may be within a range between, and including, any of the values noted above.

According to yet other embodiments, the dielectric coating 205 may have a particular average thickness. For example, the average thickness of the dielectric coating 205 may be at least about 0.1 microns, such as, at least about 0.5 microns or at least about 1 micron or at least about 2 microns or at least about 3 microns or at least about 4 microns or even at least about 5 microns. According to yet other embodiments, the average thickness of the dielectric coating 205 may be not greater than about 20 microns, such as, not greater than about 18 microns or not greater than about 16 microns or not greater than about 14 microns or not greater than about 12 microns or even not greater than about 10 microns. It will be appreciated that the average thickness of the dielectric coating 205 may be any value between, and including, any of the minimum and maximum values noted above. It will be further appreciated that the average thickness of the dielectric coating 205 may be within a range between, and including, any of the minimum and maximum values noted above.

According to yet other embodiments, the dielectric coating 205 may have a particular dissipation factor (Df) as measured in the range between 5 GHz, 20% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 5 GHz, 80% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 10 GHz, 20% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 10 GHz, 80% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 28 GHz, 20% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 28 GHz, 80% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 39 GHz, 20% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 39 GHz, 80% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 76-81 GHz, 20% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above.

According to yet other embodiments, the dielectric coating 205 may have a particular dissipation factor (Df) as measured in the range between 76-81 GHz, 80% RH. For example, the dielectric coating 205 may have a dissipation factor of not greater than about 0.005, such as, not greater than about 0.004 or not greater than about 0.003 or not greater than about 0.002 or not greater than about 0.0019 or not greater than about 0.0018 or not greater than about 0.0017 or not greater than about 0.0016 or not greater than about 0.0015 or not greater than about 0.0014. It will be appreciated that the dissipation factor of the dielectric coating 205 may be any value between, and including, any of the values noted above. It will be further appreciated that the dissipation factor of the dielectric coating 205 may be within a range between, and including, any of the values noted above. According to yet other embodiments, the dielectric coating 205 may have a particular coefficient of thermal expansion as measured according to IPC-TM-650 2.4.24 Rev. C Glass Transition Temperature and Z-Axis Thermal Expansion by TMA. For example, the dielectric coating 205 may have a coefficient of thermal expansion of not greater than about 80 ppm/° C.

According to yet other embodiments, the copper-clad laminate 201 may have a particular coefficient of thermal expansion as measured according to IPC-TM-650 2.4.24 Rev. C Glass Transition Temperature and Z-Axis Thermal Expansion by TMA. For example, the copper-clad laminate 201 may have a coefficient of thermal expansion of not greater than about 45 ppm/° C.

It will be appreciated that any copper-clad laminate described herein may include additional polymer based layers between the coating and any copper foil layer of the copper-clad laminate. As also noted herein, the additional polymer based layers may include filler (i.e. be filled polymer layers) as described herein or may not include fillers (i.e. be unfilled polymer layers).

Figure 3:
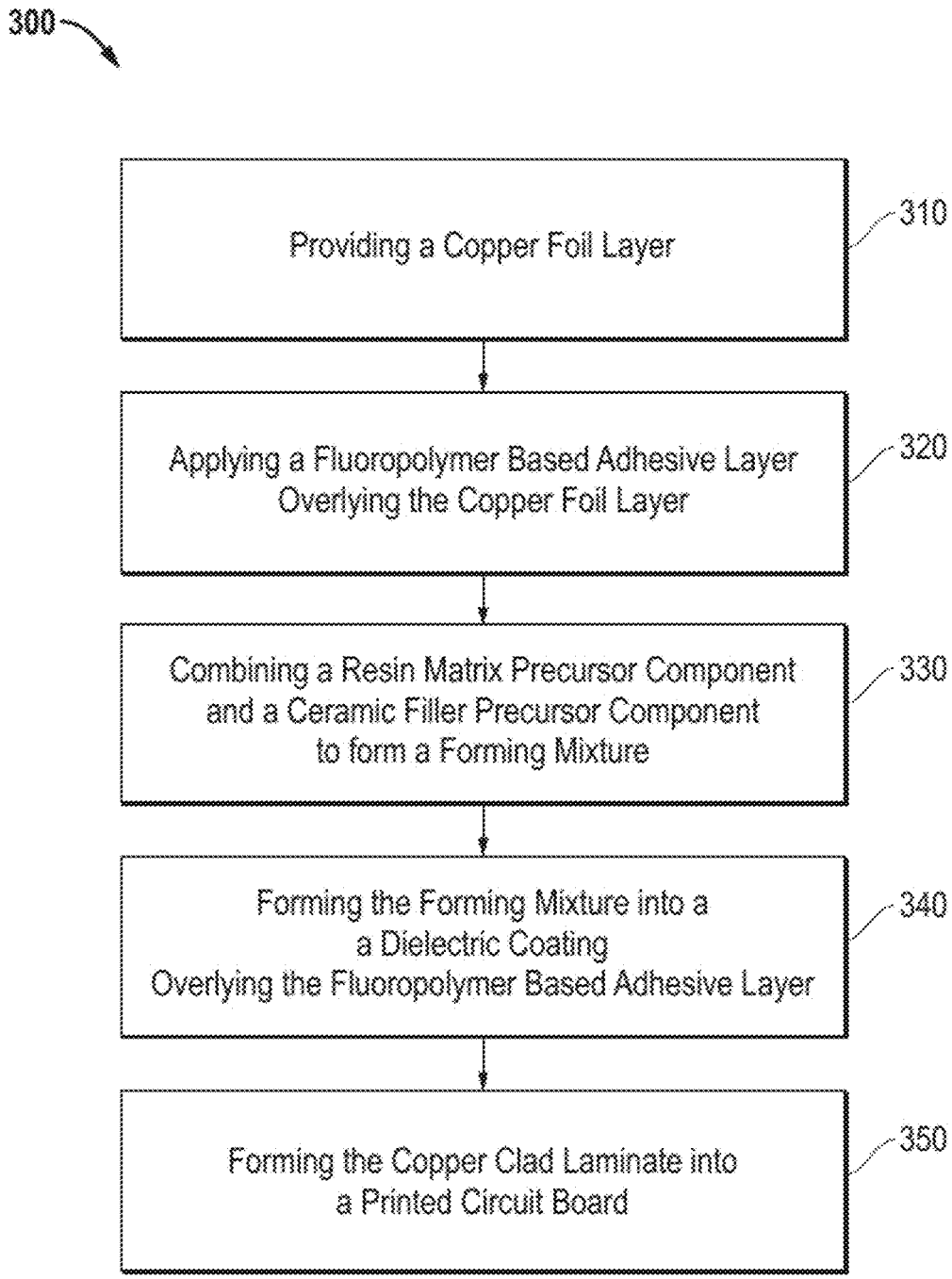
FIG. 3 includes a diagram showing a printed circuit board forming method according to embodiments described herein.

Referring next to a method of forming a printed circuit board, FIG. 3 includes a diagram showing a forming method 300 for forming a printed circuit board according to embodiments described herein. According to particular embodiments, the forming method 300 may include a first step 310 of providing a copper foil layer, a second step 320 applying a fluoropolymer based adhesive layer overlying the copper foil layer, a third step 330 of combining a resin matrix precursor component and a ceramic filler precursor component to form a forming mixture, a fourth step 340 of forming the forming mixture into a dielectric coating overlying the copper foil layer to form a copper-clad laminate, and a fifth step 350 of forming the copper-clad laminate into a printed circuit board.

It will be appreciated that all description, details and characteristics provided herein in reference to forming method 100 may further apply to or describe correspond aspects of forming method 300.

Figure 4:
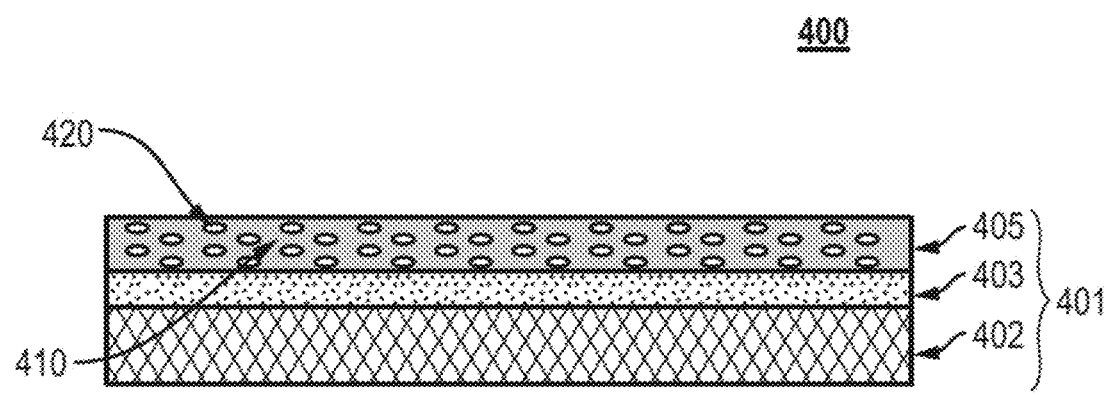
FIG. 4 includes an illustration showing the configuration of a printed circuit board formed according to embodiments described herein.

Referring now to embodiments of the printed circuit board formed according to forming method 300, FIG. 4 includes diagram of a printed circuit board 400. As shown in FIG. 4, the printed circuit board 400 may include a copper-clad laminate 401, which may include a copper foil layer 402, a fluoropolymer based adhesive layer 403 overlying the copper foil layer 402, and a dielectric coating 405 overlying a surface of the fluoropolymer based adhesive layer 403. According to certain embodiments, the dielectric coating 405 may include a resin matrix component 410 and a ceramic filler component 420.

Again, it will be appreciated that all description provided herein in reference to dielectric coating 205 and/or copper-clad laminate 200 may further apply to correcting aspects of the printed circuit board 200, including all components of printed circuit board 400.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

Embodiment 1. A copper-clad laminate comprising: a copper foil layer, a fluoropolymer based adhesive layer overlying the copper foil layer, and a dielectric coating overlying the fluoropolymer based adhesive layer, wherein the dielectric coating comprises: a resin matrix component; and a ceramic filler component, wherein the ceramic filler component comprises a first filler material, and wherein the dielectric coating has an average thickness of not greater than about 20 microns.

Embodiment 2. A copper-clad laminate comprising: a copper foil layer, a fluoropolymer based adhesive layer overlying the copper foil layer, and a dielectric coating overlying the fluoropolymer based adhesive layer, wherein the dielectric coating comprises: a resin matrix component; and a ceramic filler component, wherein the ceramic filler component comprises a first filler material, and wherein a particle size distribution of the first filler material comprises: a D10 of at least about 0.2 microns and not greater than about 1.6, a D50 of at least about 0.5 microns and not greater than about 2.7 microns, and a D90 of at least about 0.8 microns and not greater than about 4.7 microns.

Embodiment 3. A copper-clad laminate comprising: a copper foil layer, a fluoropolymer based adhesive layer overlying the copper foil layer, and a dielectric coating overlying the fluoropolymer based adhesive layer, wherein the dielectric coating comprises: a resin matrix component; and a ceramic filler component, wherein the ceramic filler component comprises a first filler material, and wherein the first filler material further comprises a mean particle size of at not greater than about 5 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 4. The copper-clad laminate of any one of embodiments 1, 2, and 3, wherein the fluoropolymer based adhesive layer has an average thickness of at least about 0.2 microns.

Embodiment 5. The copper-clad laminate of any one of embodiments 1, 2, and 3, wherein the fluoropolymer based adhesive layer has an average thickness of not greater than about 7 microns.

Embodiment 6. The copper-clad laminate of any one of embodiments 1, 2, and 3, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 7. The copper-clad laminate of any one of embodiments 1, 2, and 3, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 8. The copper-clad laminate of any one of embodiments 1, 2, and 3, wherein the fluoropolymer based adhesive layer is a PFA layer.

Embodiment 9. The copper-clad laminate of any one of embodiments 1, 2, and 3, wherein a particle size distribution of the first filler material comprises a D10 of at least about 0.2 microns and not greater than about 1.6.

Embodiment 10. The copper-clad laminate of any one of embodiments 1, 2, and 3, wherein a particle size distribution of the first filler material comprises a D50 of at least about 0.5 microns and not greater than about 2.7 microns.

Embodiment 11. The copper-clad laminate of any one of embodiments 1, 2, and 3, wherein a particle size distribution of the first filler material comprises a D90 of at least about 0.8 microns and not greater than about 4.7 microns.

Embodiment 12. The copper-clad laminate of embodiment 1, wherein the first filler material further comprises a mean particle size of at not greater than about 10 microns.

Embodiment 13. The copper-clad laminate of any one of embodiments 1, 2, and 3, wherein the first filler material comprises a mean particle size of not greater than about 10 microns.

Embodiment 14. The copper-clad laminate of any one of embodiments 1, 2, and 3, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 15. The copper-clad laminate of any one of embodiments 1, 2, and 3, wherein the first filler material further comprises an average surface area of not greater than about 10 $m^2/g$.

Embodiment 16. The copper-clad laminate of any one of embodiments 1, 2, and 3, wherein the first filler material comprises a silica based compound.

Embodiment 17. The copper-clad laminate of any one of embodiments 1, 2, and 3, wherein the first filler material comprises silica.

Embodiment 18. The copper-clad laminate of any one of embodiments 1, 2, and 3, wherein the resin matrix comprises a perfluoropolymer.

Embodiment 19. The copper-clad laminate of embodiment 18, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 20. The copper-clad laminate of embodiment 18, wherein the perfluoropolymer comprises polytetrafluoroethylene (PTFE), perfluoroalkoxy polymer resin (PFA), fluorinated ethylene propylene (FEP), or any combination thereof.

Embodiment 21. The copper-clad laminate of embodiment 18, wherein the perfluoropolymer consists of polytetrafluoroethylene (PTFE), perfluoroalkoxy polymer resin (PFA), fluorinated ethylene propylene (FEP), or any combination thereof.

Embodiment 22. The copper-clad laminate of any one of embodiments 1, 2, and 3, wherein the content of the resin matrix component is at least about 50 vol. % for a total volume of the dielectric coating.

Embodiment 23. The copper-clad laminate of any one of embodiments 1, 2, and 3, wherein the content of the resin matrix component is not greater than about 63 vol. % for a total volume of the dielectric coating.

Embodiment 24. The copper-clad laminate of embodiment 18, wherein the content of the perfluoropolymer is at least about 50 vol. % for a total volume of the dielectric coating.

Embodiment 25. The copper-clad laminate of embodiment 18, wherein the content of the perfluoropolymer is not greater than about 63 vol. % for a total volume of the dielectric coating.

Embodiment 26. The copper-clad laminate of any one of embodiments 1, 2, and 3, wherein the content of the ceramic filler component is at least about 30 vol. % for a total volume of the dielectric coating.

Embodiment 27. The copper-clad laminate of any one of embodiments 1, 2, and 3, wherein the content of the ceramic filler component is not greater than about 57 vol. % for a total volume of the dielectric coating.

Embodiment 28. The copper-clad laminate of any one of embodiments 1, 2, and 3, wherein the content of the first filler material is at least about 80 vol. % for a total volume of the ceramic filler component.

Embodiment 29. The copper-clad laminate of any one of embodiments 1, 2, and 3, wherein the content of the first filler material is not greater than about 100 vol. % for a total volume of the ceramic filler component.

Embodiment 30. The copper-clad laminate of any one of embodiments 1, 2, and 3, wherein the ceramic filler component further comprises a second filler material.

Embodiment 31. The copper-clad laminate of embodiment 30, wherein the second filler material comprises a high dielectric constant ceramic material.

Embodiment 32. The copper-clad laminate of embodiment 31, wherein the high dielectric constant ceramic material has a dielectric constant of at least about 14.

Embodiment 33. The copper-clad laminate of embodiment 31, wherein the ceramic filler component further comprises $TiO_2$, $SrTiO_3$, $ZrTi_2O_6$, $MgTiO_3$, $CaTiO_3$, $BaTiO_4$ or any combination thereof.

Embodiment 34. The copper-clad laminate of embodiment 30, wherein the content of the second filler material is at least about 1 vol. % for a total volume of the ceramic filler component.

Embodiment 35. The copper-clad laminate of embodiment 30, wherein the content of the second filler material is not greater than about 20 vol. % for a total volume of the ceramic filler component.

Embodiment 36. The copper-clad laminate of any one of embodiments 1, 2, and 3, wherein the ceramic filler component is at least about 97% amorphous.

Embodiment 37. The copper-clad laminate of any one of embodiments 1, 2, and 3, wherein the dielectric coating comprises a porosity of not greater than about 10 vol. %

Embodiment 38. The copper-clad laminate of any one of embodiments 1, 2, and 3, wherein the copper-clad laminate comprises a porosity of not greater than about 10 vol. %.

Embodiment 39. The copper-clad laminate of any one of embodiments 1, 2, and 3, wherein the dielectric coating comprises an average thickness of at least about 1 micron.

Embodiment 40. The copper-clad laminate of any one of embodiments 1, 2, and 3, wherein the dielectric coating comprises an average thickness of not greater than about 20 microns.

Embodiment 41. The copper-clad laminate of any one of embodiments 1, 2, and 3, wherein the dielectric coating comprises a dissipation factor (5 GHz, 20% RH) of not greater than about 3.5.

Embodiment 42. The copper-clad laminate of any one of embodiments 1, 2, and 3, wherein the dielectric coating comprises a dissipation factor (5 GHz, 20% RH)) of not greater than about 0.001.

Embodiment 43. The copper-clad laminate of any one of embodiments 1, 2, and 3, wherein the dielectric coating comprises a coefficient of thermal expansion (all axes) of not greater than about 80 ppm/° C.

Embodiment 44. The copper-clad laminate of any one of embodiments 1, 2, and 3, wherein the copper-clad laminate comprises a peel strength between the copper foil layer and the dielectric coating of at least about 6 lb/in.

Embodiment 45. The copper-clad laminate of any one of embodiments 1, 2, and 3, wherein the dielectric coating comprises a moisture absorption of not greater than about 0.05%.

Embodiment 46. The copper-clad laminate of any one of embodiments 1, 2, and 3, wherein the copper foil layer comprises an average thickness of at least about 6 microns.

Embodiment 47. The copper-clad laminate of any one of embodiments 1, 2, and 3, wherein the copper foil layer comprises an average thickness of not greater than about 36 microns.

Embodiment 48. A printed circuit board comprising a copper-clad laminate, wherein the copper-clad laminate comprises: a copper foil layer, a fluoropolymer based adhesive layer overlying the copper foil layer, and a dielectric coating overlying the fluoropolymer based adhesive layer, wherein the dielectric coating comprises: a resin matrix component; and a ceramic filler component, wherein the ceramic filler component comprises a first filler material, and wherein the dielectric coating has an average thickness of not greater than 20 microns.

Embodiment 49. A printed circuit board comprising a copper-clad laminate, wherein the copper-clad laminate comprises: a copper foil layer, a fluoropolymer based adhesive layer overlying the copper foil layer, and a dielectric coating overlying the fluoropolymer based adhesive layer, wherein the dielectric coating comprises: a resin matrix component; and a ceramic filler component, wherein the ceramic filler component comprises a first filler material, and wherein a particle size distribution of the first filler material comprises: a $D_{10}$ of at least about 0.2 microns and not greater than about 1.6, a $D_{50}$ of at least about 0.5 microns and not greater than about 2.7 microns, and a D90 of at least about 0.8 microns and not greater than about 4.7 microns.

Embodiment 50. A printed circuit board comprising a copper-clad laminate, wherein the copper-clad laminate comprises: a copper foil layer a fluoropolymer based adhesive layer overlying the copper foil layer, and a dielectric coating overlying the fluoropolymer based adhesive layer, wherein the dielectric coating comprises: a resin matrix component; and a ceramic filler component, wherein the ceramic filler component comprises a first filler material, and wherein the first filler material further comprises a mean particle size of at not greater than about 5 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 51. The printed circuit board of any one of embodiments 48, 49 and 50, wherein the fluoropolymer based adhesive layer has an average thickness of at least about 0.2 microns.

Embodiment 52. The printed circuit board of any one of embodiments 48, 49 and 50, wherein the fluoropolymer based adhesive layer has an average thickness of not greater than about 7 microns.

Embodiment 53. The printed circuit board of any one of embodiments 48, 49 and 50, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 54. The printed circuit board of any one of embodiments 48, 49 and 50, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 55. The printed circuit board of any one of embodiments 48, 49 and 50, wherein the fluoropolymer based adhesive layer is a PFA layer.

Embodiment 56. The printed circuit board of any one of embodiments 48, 49 and 50, wherein a particle size distribution of the first filler material comprises a D10 of at least about 0.2 microns and not greater than about 1.6.

Embodiment 57. The printed circuit board of any one of embodiments 48, 49 and 50, wherein a particle size distribution of the first filler material comprises a D50 of at least about 0.5 microns and not greater than about 2.7 microns.

Embodiment 58. The printed circuit board of any one of embodiments 48, 49 and 50, wherein a particle size distribution of the first filler material comprises a D90 of at least about 0.8 microns and not greater than about 4.7 microns.

Embodiment 59. The printed circuit board of any one of embodiments 48, 49 and 50, wherein the first filler material further comprises a mean particle size of at not greater than about 10 microns.

Embodiment 60. The printed circuit board of any one of embodiments 48, 49 and 50, wherein the first filler material comprises a mean particle size of not greater than about 10 microns.

Embodiment 61. The printed circuit board of any one of embodiments 48, 49 and 50, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

Embodiment 62. The printed circuit board of any one of embodiments 48, 49 and 50, wherein the first filler material further comprises an average surface area of not greater than about 10 $m^2/g$.

Embodiment 63. The printed circuit board of any one of embodiments 48, 49 and 50, wherein the first filler material comprises a silica based compound.

Embodiment 64. The printed circuit board of any one of embodiments 48, 49 and 50, wherein the first filler material comprises silica.

Embodiment 65. The printed circuit board of any one of embodiments 48, 49 and 50, wherein the resin matrix comprises a perfluoropolymer.

Embodiment 66. The printed circuit board of embodiment 65, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 67. The printed circuit board of embodiment 65, wherein the perfluoropolymer comprises polytetrafluoroethylene (PTFE), perfluoroalkoxy polymer resin (PFA), fluorinated ethylene propylene (FEP), or any combination thereof.

Embodiment 68. The printed circuit board of embodiment 65, wherein the perfluoropolymer consists of polytetrafluoroethylene (PTFE), perfluoroalkoxy polymer resin (PFA), fluorinated ethylene propylene (FEP), or any combination thereof.

Embodiment 69. The printed circuit board of any one of embodiments 48, 49 and 50, wherein the content of the resin matrix component is at least about 50 vol. % for a total volume of the dielectric coating.

Embodiment 70. The printed circuit board of any one of embodiments 48, 49 and 50, wherein the content of the resin matrix component is not greater than about 63 vol. % for a total volume of the dielectric coating.

Embodiment 71. The printed circuit board of embodiment 65, wherein the content of the perfluoropolymer is at least about 50 vol. % for a total volume of the dielectric coating.

Embodiment 72. The printed circuit board of embodiment 65, wherein the content of the perfluoropolymer is not greater than about 63 vol. % for a total volume of the dielectric coating.

Embodiment 73. The printed circuit board of any one of embodiments 48, 49 and 50, wherein the content of the ceramic filler component is at least about 50 vol. % for a total volume of the dielectric coating.

Embodiment 74. The printed circuit board of any one of embodiments 48, 49 and 50, wherein the content of the ceramic filler component is not greater than about 57 vol. % for a total volume of the dielectric coating.

Embodiment 75. The printed circuit board of any one of embodiments 48, 49 and 50, wherein the content of the first filler material is at least about 80 vol. % for a total volume of the ceramic filler component.

Embodiment 76. The printed circuit board of any one of embodiments 48, 49 and 50, wherein the content of the first filler material is not greater than about 100 vol. % for a total volume of the ceramic filler component.

Embodiment 77. The printed circuit board of any one of embodiments 48, 49 and 50, wherein the ceramic filler component further comprises a second filler material.

Embodiment 78. The printed circuit board of embodiment 77, wherein the second filler material comprises a high dielectric constant ceramic material.

Embodiment 79. The printed circuit board of embodiment 78, wherein the high dielectric constant ceramic material has a dielectric constant of at least about 14.

Embodiment 80. The printed circuit board of embodiment 78, wherein the ceramic filler component further comprises $TiO_2$, $SrTiO_3$, $ZrTi_2O_6$, $MgTiO_3$, $CaTiO_3$, $BaTiO_4$ or any combination thereof.

Embodiment 81. The printed circuit board of embodiment 77, wherein the content of the second filler material is at least about 1 vol. % for a total volume of the ceramic filler component.

Embodiment 82. The printed circuit board of embodiment 77, wherein the content of the second filler material is not greater than about 20 vol. % for a total volume of the ceramic filler component.

Embodiment 83. The printed circuit board of any one of embodiments 48, 49 and 50, wherein the ceramic filler component is at least about 97% amorphous.

Embodiment 84. The printed circuit board of any one of embodiments 48, 49 and 50, wherein the dielectric coating comprises a porosity of not greater than about 10 vol. %

Embodiment 85. The printed circuit board of any one of embodiments 48, 49 and 50, wherein the copper-clad laminate comprises a porosity of not greater than about 10 vol. %.

Embodiment 86. The printed circuit board of any one of embodiments 48, 49 and 50, wherein the dielectric coating comprises an average thickness of at least about 1 micron.

Embodiment 87. The printed circuit board of any one of embodiments 48, 49 and 50, wherein the dielectric coating comprises an average thickness of not greater than about 20 microns.

Embodiment 88. The printed circuit board of any one of embodiments 48, 49 and 50, wherein the dielectric coating comprises a dissipation factor (5 GHz, 20% RH) of not greater than about 0.005.

Embodiment 89. The printed circuit board of any one of embodiments 48, 49 and 50, wherein the dielectric coating comprises a dissipation factor (5 GHz, 20% RH)) of not greater than about 0.0014.

Embodiment 90. The printed circuit board of any one of embodiments 48, 49 and 50, wherein the dielectric coating comprises a coefficient of thermal expansion (all axes) of not greater than about 80 ppm/° C.

Embodiment 91. The printed circuit board of any one of embodiments 48, 49 and 50, wherein the copper-clad laminate comprises a peel strength between the copper foil layer and the dielectric coating of at least about 6 lb/in.

Embodiment 92. The printed circuit board of any one of embodiments 48, 49 and 50, wherein the dielectric coating comprises a moisture absorption of not greater than about 0.05%.

Embodiment 93. The printed circuit board of any one of embodiments 48, 49 and 50, wherein the copper foil layer comprises an average thickness of at least about 6 microns.

Embodiment 94. The printed circuit board of any one of embodiments 48, 49 and 50, wherein the copper foil layer comprises an average thickness of not greater than about 36 microns.

Embodiment 95. A method of forming a copper-clad laminate, wherein the method comprises: providing a copper foil layer, applying a fluoropolymer based adhesive layer overlying the copper foil layer, combining a resin matrix precursor component and a ceramic filler precursor component to form a forming mixture, forming the forming mixture into a dielectric coating overlying the fluoropolymer based adhesive layer, wherein the dielectric coating has an average thickness of not greater than about 20 microns.

Embodiment 96. A method of forming a copper-clad laminate, wherein the method comprises: providing a copper foil layer, applying a fluoropolymer based adhesive layer overlying the copper foil layer, combining a resin matrix precursor component and a ceramic filler precursor component to form a forming mixture, forming the forming mixture into a dielectric coating overlying the fluoropolymer based adhesive layer, wherein the ceramic filler precursor component comprises a first filler precursor material, and wherein a particle size distribution of the first filler precursor material comprises: a D10 of at least about 0.2 microns and not greater than about 1.6, a D50 of at least about 0.5 microns and not greater than about 2.7 microns, and a D90 of at least about 0.8 microns and not greater than about 4.7 microns.

Embodiment 97. A method of forming a copper-clad laminate, wherein the method comprises: providing a copper foil layer, applying a fluoropolymer based adhesive layer overlying the copper foil layer, combining a resin matrix precursor component and a ceramic filler precursor component to form a forming mixture, forming the forming mixture into a dielectric coating overlying the fluoropolymer based adhesive layer, wherein the ceramic filler precursor component comprises a first filler precursor material, and wherein the first filler precursor material further comprises a mean particle size of at not greater than about 5 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 98. The method of any one of embodiments 95, 96, and 97, wherein the fluoropolymer based adhesive layer has an average thickness of at least about 0.2 microns.

Embodiment 99. The method of any one of embodiments 95, 96, and 97, wherein the fluoropolymer based adhesive layer has an average thickness of not greater than about 7 microns.

Embodiment 100. The method of any one of embodiments 95, 96, and 97, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 101. The method of any one of embodiments 95, 96, and 97, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 102. The method of any one of embodiments 95, 96, and 97, wherein the fluoropolymer based adhesive layer is a PFA layer.

Embodiment 103. The method of any one of embodiments 95, 96, and 97, wherein a particle size distribution of the first filler precursor material comprises a D10 of at least about 0.2 microns and not greater than about 1.6.

Embodiment 104. The method of any one of embodiments 95, 96, and 97, wherein a particle size distribution of the first filler precursor material comprises a D50 of at least about 0.5 microns and not greater than about 2.7 microns.

Embodiment 105. The method of any one of embodiments 95, 96, and 97, wherein a particle size distribution of the first filler precursor material comprises a D90 of at least about 0.8 microns and not greater than about 4.7 microns.

Embodiment 106. The method of embodiment 95, wherein the first filler precursor material further comprises a mean particle size of at not greater than about 10 microns.

Embodiment 107. The method of any one of embodiments 95, 96, and 97, wherein the first filler precursor material comprises a mean particle size of not greater than about 10 microns.

Embodiment 108. The method of any one of embodiments 95, 96, and 97, wherein the first filler precursor material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 109. The method of any one of embodiments 95, 96, and 97, wherein the first filler precursor material further comprises an average surface area of not greater than about 10 m²/g.

Embodiment 110. The method of any one of embodiments 95, 96, and 97, wherein the first filler precursor material comprises a silica based compound.

Embodiment 111. The method of any one of embodiments 95, 96, and 97, the first filler precursor material comprises silica.

Embodiment 112. The method of any one of embodiments 95, 96, and 97, wherein the resin matrix precursor component comprises a perfluoropolymer.

Embodiment 113. The method of embodiment 112, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 114. The method of embodiment 112, wherein the perfluoropolymer comprises polytetrafluoroethylene (PTFE), perfluoroalkoxy polymer resin (PFA), fluorinated ethylene propylene (FEP), or any combination thereof.

Embodiment 115. The method of embodiment 112, wherein the perfluoropolymer consists of polytetrafluoroethylene (PTFE), perfluoroalkoxy polymer resin (PFA), fluorinated ethylene propylene (FEP), or any combination thereof.

Embodiment 116. The method of any one of embodiments 95, 96, and 97, wherein the content of the resin matrix precursor component is at least about 50 vol. % for a total volume of the dielectric coating.

Embodiment 117. The method of any one of embodiments 95, 96, and 97, wherein the content of the resin matrix precursor component is not greater than about 63 vol. % for a total volume of the dielectric coating.

Embodiment 118. The method of embodiment 112, wherein the content of the perfluoropolymer is at least about 50 vol. % for a total volume of the dielectric coating.

Embodiment 119. The method of embodiment 112, wherein the content of the perfluoropolymer is not greater than about 63 vol. % for a total volume of the dielectric coating.

Embodiment 120. The method of any one of embodiments 95, 96, and 97, wherein the content of the ceramic filler precursor component is at least about 50 vol. % for a total volume of the dielectric coating.

Embodiment 121. The method of any one of embodiments 95, 96, and 97, wherein the content of the ceramic filler precursor component is not greater than about 57 vol. % for a total volume of the dielectric coating.

Embodiment 122. The method of any one of embodiments 95, 96, and 97, wherein the content of the first filler precursor material is at least about 80 vol. % for a total volume of the ceramic filler precursor component.

Embodiment 123. The method of any one of embodiments 95, 96, and 97, wherein the content of the first filler precursor material is not greater than about 100 vol. % for a total volume of the ceramic filler precursor component.

Embodiment 124. The method of any one of embodiments 95, 96, and 97, wherein the ceramic filler precursor component further comprises a second filler precursor material.

Embodiment 125. The method of embodiment 124, wherein the second filler precursor material comprises a high dielectric constant ceramic material.

Embodiment 126. The method of embodiment 125, wherein the high dielectric constant ceramic material has a dielectric constant of at least about 14.

Embodiment 127. The method of embodiment 125, wherein the ceramic filler precursor component further comprises $TiO_2$, $SrTiO_3$, $ZrTi_2O_6$, $MgTiO_3$, $CaTiO_3$, $BaTiO_4$ or any combination thereof.

Embodiment 128. The method of embodiment 124, wherein the content of the second filler precursor material is at least about 1 vol. % for a total volume of the ceramic filler precursor component.

Embodiment 129. The method of embodiment 124, wherein the content of the second filler precursor material is not greater than about 20 vol. % for a total volume of the ceramic filler precursor component.

Embodiment 130. The method of any one of embodiments 95, 96, and 97, wherein the ceramic filler precursor component is at least about 97% amorphous.

Embodiment 131. The method of any one of embodiments 95, 96, and 97, wherein the dielectric coating comprises a porosity of not greater than about 10 vol. %

Embodiment 132. The method of any one of embodiments 95, 96, and 97, wherein the copper-clad laminate comprises a porosity of not greater than about 10 vol. %.

Embodiment 133. The method of any one of embodiments 95, 96, and 97, wherein the dielectric coating comprises an average thickness of at least about 1 micron.

Embodiment 134. The method of any one of embodiments 95, 96, and 97, wherein the dielectric coating comprises an average thickness of not greater than about 20 microns.

Embodiment 135. The method of any one of embodiments 95, 96, and 97, wherein the dielectric coating comprises a dissipation factor (5 GHz, 20% RH) of not greater than about 0.005.

Embodiment 136. The method of any one of embodiments 95, 96, and 97, wherein the dielectric coating comprises a dissipation factor (5 GHz, 20% RH)) of not greater than about 0.0014.

Embodiment 137. The method of any one of embodiments 95, 96, and 97, wherein the dielectric coating comprises a coefficient of thermal expansion (all axes) of not greater than about 80 ppm/° C.

Embodiment 138. The method of any one of embodiments 95, 96, and 97, wherein the copper-clad laminate comprises a peel strength between the copper foil layer and the dielectric coating of at least about 6 lb/in.

Embodiment 139. The method of any one of embodiments 95, 96, and 97, wherein the dielectric coating comprises a moisture absorption of not greater than about 0.05%.

Embodiment 140. The method of any one of embodiments 95, 96, and 97, wherein the copper foil layer comprises an average thickness of at least about 6 microns.

Embodiment 141. The method of any one of embodiments 95, 96, and 97, wherein the copper foil layer comprises an average thickness of not greater than about 36 microns.

Embodiment 142. A method of forming a printed circuit board, wherein the method comprises: providing a copper foil layer, applying a fluoropolymer based adhesive layer overlying the copper foil layer, combining a resin matrix precursor component and a ceramic filler precursor component to form a forming mixture, forming the forming mixture into a dielectric coating overlying the fluoropolymer based adhesive layer, wherein the dielectric coating has an average thickness of not greater than about 20 microns.

Embodiment 143. A method of forming a printed circuit board, wherein the method comprises: providing a copper foil layer, applying a fluoropolymer based adhesive layer overlying the copper foil layer, combining a resin matrix precursor component and a ceramic filler precursor component to form a forming mixture, forming the forming mixture into a dielectric coating overlying the fluoropolymer based adhesive layer, wherein the ceramic filler precursor component comprises a first filler precursor material, and wherein a particle size distribution of the first filler precursor material comprises: a D10 of at least about 0.2 microns and not greater than about 1.6, a D50 of at least about 0.5 microns and not greater than about 2.7 microns, and a D90 of at least about 0.8 microns and not greater than about 4.7 microns.

Embodiment 144. A method of forming a printed circuit board, wherein the method comprises: providing a copper foil layer, applying a fluoropolymer based adhesive layer overlying the copper foil layer, combining a resin matrix precursor component and a ceramic filler precursor component to form a forming mixture, forming the forming mixture into a dielectric coating overlying the fluoropolymer based adhesive layer, wherein the ceramic filler precursor component comprises a first filler precursor material, and wherein the first filler precursor material further comprises a mean particle size of at not greater than about 5 microns, and a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 145. The method of any one of embodiments 142, 143, and 144, wherein the fluoropolymer based adhesive layer has an average thickness of at least about 0.2 microns.

Embodiment 146. The method of any one of embodiments 142, 143, and 144, wherein the fluoropolymer based adhesive layer has an average thickness of not greater than about 7 microns.

Embodiment 147. The method of any one of embodiments 142, 143, and 144, wherein the fluoropolymer based adhesive layer comprises fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 148. The method of any one of embodiments 142, 143, and 144, wherein the fluoropolymer based adhesive layer consists of fluoropolymers (e.g., polytetrafluoroethylene (PTFE), modified polytetrafluoroethylene (mPTFE), co- and terpolymers of tetrafluoroethylene such as fluorinated ethylene-propylene (FEP), perfluoroalkoxy polymer resin (PFA), and modified perfluoroalkoxy polymer resin (mPFA), and derivatives and blends thereof.

Embodiment 149. The method of any one of embodiments 142, 143, and 144, wherein the fluoropolymer based adhesive layer is a PFA layer.

Embodiment 150. The method of any one of embodiments 142, 143, and 144, wherein a particle size distribution of the first filler precursor material comprises a D10 of at least about 0.2 microns and not greater than about 1.6.

Embodiment 151. The method of any one of embodiments 142, 143, and 144, wherein a particle size distribution of the first filler precursor material comprises a D50 of at least about 0.5 microns and not greater than about 2.7 microns.

Embodiment 152. The method of any one of embodiments 142, 143, and 144, wherein a particle size distribution of the first filler precursor material comprises a D90 of at least about 0.8 microns and not greater than about 4.7 microns.

Embodiment 153. The method of embodiment 152, wherein the first filler precursor material further comprises a mean particle size of at not greater than about 10 microns.

Embodiment 154. The method of any one of embodiments 142, 143, and 144, wherein the first filler precursor material comprises a mean particle size of not greater than about 10 microns.

Embodiment 155. The method of any one of embodiments 142, 143, and 144, wherein the first filler precursor material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler precursor material, $D_{10}$ is equal to a $D_{10}$ particle size distribution measurement of the first filler precursor material, and $D_{50}$ is equal to a $D_{50}$ particle size distribution measurement of the first filler precursor material.

Embodiment 156. The method of any one of embodiments 142, 143, and 144, wherein the first filler precursor material further comprises an average surface area of not greater than about 10 $m^2/g$.

Embodiment 157. The method of any one of embodiments 142, 143, and 144, wherein the first filler precursor material comprises a silica based compound.

Embodiment 158. The method of any one of embodiments 142, 143, and 144, the first filler precursor material comprises silica.

Embodiment 159. The method of any one of embodiments 142, 143, and 144, wherein the resin matrix precursor component comprises a perfluoropolymer.

Embodiment 160. The method of embodiment 159, wherein the perfluoropolymer comprises a copolymer of tetrafluoroethylene (TFE); a copolymer of hexafluoropropylene (HFP); a terpolymer of tetrafluoroethylene (TFE); or any combination thereof.

Embodiment 161. The method of embodiment 159, wherein the perfluoropolymer comprises polytetrafluoroethylene (PTFE), perfluoroalkoxy polymer resin (PFA), fluorinated ethylene propylene (FEP), or any combination thereof.

Embodiment 162. The method of embodiment 159, wherein the perfluoropolymer consists of polytetrafluoroethylene (PTFE), perfluoroalkoxy polymer resin (PFA), fluorinated ethylene propylene (FEP), or any combination thereof.

Embodiment 163. The method of any one of embodiments 142, 143, and 144, wherein the content of the resin matrix precursor component is at least about 50 vol. % for a total volume of the dielectric coating.

Embodiment 164. The method of any one of embodiments 142, 143, and 144, wherein the content of the resin matrix precursor component is not greater than about 63 vol. % for a total volume of the dielectric coating.

Embodiment 165. The method of embodiment 159, wherein the content of the perfluoropolymer is at least about 50 vol. % for a total volume of the dielectric coating.

Embodiment 166. The method of embodiment 159, wherein the content of the perfluoropolymer is not greater than about 63 vol. % for a total volume of the dielectric coating.

Embodiment 167. The method of any one of embodiments 142, 143, and 144, wherein the content of the ceramic filler precursor component is at least about 30 vol. % for a total volume of the dielectric coating.

Embodiment 168. The method of any one of embodiments 142, 143, and 144, wherein the content of the ceramic filler precursor component is not greater than about 57 vol. % for a total volume of the dielectric coating.

Embodiment 169. The method of any one of embodiments 142, 143, and 144, wherein the content of the first filler precursor material is at least about 80 vol. % for a total volume of the ceramic filler precursor component.

Embodiment 170. The method of any one of embodiments 142, 143, and 144, wherein the content of the first filler precursor material is not greater than about 100 vol. % for a total volume of the ceramic filler precursor component.

Embodiment 171. The method of any one of embodiments 142, 143, and 144, wherein the ceramic filler precursor component further comprises a second filler precursor material.

Embodiment 172. The dielectric coating of embodiment 171, wherein the second filler precursor material comprises a high dielectric constant ceramic material.

Embodiment 173. The dielectric coating of embodiment 172, wherein the high dielectric constant ceramic material has a dielectric constant of at least about 14.

Embodiment 174. The dielectric coating of embodiment 172, wherein the ceramic filler precursor component further comprises $TiO_2$, $SrTiO_3$, $ZrTi_2O_6$, $MgTiO_3$, $CaTiO_3$, $BaTiO_4$ or any combination thereof.

Embodiment 175. The method of embodiment 171, wherein the content of the second filler precursor material is at least about 1 vol. % for a total volume of the ceramic filler precursor component.

Embodiment 176. The method of embodiment 171, wherein the content of the second filler precursor material is not greater than about 20 vol. % for a total volume of the ceramic filler precursor component.

Embodiment 177. The method of any one of embodiments 142, 143, and 144, wherein the ceramic filler precursor component is at least about 97% amorphous.

Embodiment 178. The method of any one of embodiments 142, 143, and 144, wherein the dielectric coating comprises a porosity of not greater than about 10 vol. %

Embodiment 179. The method of any one of embodiments 142, 143, and 144, wherein the copper-clad laminate comprises a porosity of not greater than about 10 vol. %.

Embodiment 180. The method of any one of embodiments 142, 143, and 144, wherein the dielectric coating comprises an average thickness of at least about 1 micron.

Embodiment 181. The method of any one of embodiments 142, 143, and 144, wherein the dielectric coating comprises an average thickness of not greater than about 20 microns.

Embodiment 182. The method of any one of embodiments 142, 143, and 144, wherein the dielectric coating comprises a dissipation factor (5 GHz, 20% RH) of not greater than about 0.005.

Embodiment 183. The method of any one of embodiments 142, 143, and 144, wherein the dielectric coating comprises a dissipation factor (5 GHz, 20% RH)) of not greater than about 0.0014.

Embodiment 184. The method of any one of embodiments 142, 143, and 144, wherein the dielectric coating comprises a coefficient of thermal expansion (all axes) of not greater than about 80 ppm/° C.

Embodiment 185. The method of any one of embodiments 142, 143, and 144, wherein the copper-clad laminate comprises a peel strength between the copper foil layer and the dielectric coating of at least about 6 lb/in.

Embodiment 186. The method of any one of embodiments 142, 143, and 144, wherein the dielectric coating comprises a moisture absorption of not greater than about 0.05%.

Embodiment 187. The method of any one of embodiments 142, 143, and 144, wherein the copper foil layer comprises an average thickness of at least about 6 microns.

Embodiment 188. The method of any one of embodiments 142, 143, and 144, wherein the copper foil layer comprises an average thickness of not greater than about 36 microns.

metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each sample dielectric substrates S1-S12 is polytetrafluoroethylene (PTFE). Further configuration and composition details of each dielectric substrate S1-S12 are summarized in Table 1 below.

TABLE 1

Sample Dielectric Substrate Configuration and Composition

| | | | Dielectric Substrate Composition | | | |
|---|---|---|---|---|---|---|
| Sample No. | Sample Thickness (mil) | Silica Based Component Type | Ceramic Filler Component (vol. % of dielectric substrate) | Resin Matrix Component (vol. % of dielectric substrate) | First Filler Material- Silica Based Component (vol. % of Ceramic Filler Component) | Second Ceramic Filler Material ($TiO_2$) (vol. % of Ceramic Filler Component) |
| S1 | 5 | A | 54.4 | 45.6 | 96.1 | 3.9 |
| S2 | 5 | A | 54.4 | 45.6 | 96.1 | 3.9 |
| S3 | 5 | A | 54.4 | 45.6 | 96.1 | 3.9 |
| S4 | 3 | A | 54.4 | 45.6 | 96.1 | 3.9 |
| S5 | 4 | A | 54.4 | 45.6 | 100.00 | 0.0 |
| S6 | 4 | A | 54.4 | 45.6 | 100.0 | 0.0 |
| S7 | 4 | A | 54.4 | 45.6 | 100.0 | 0.0 |
| S8 | 4 | A | 54.4 | 45.6 | 100.0 | 0.0 |
| S9 | 2 | A | 55.0 | 45.0 | 100.0 | 0.0 |
| S10 | 2 | B | 54.4 | 45.6 | 100.0 | 0.0 |
| S11 | 4 | A | 48.0 | 52.0 | 100.0 | 0.0 |
| S12 | 4 | A | 48.0 | 52.0 | 100.0 | 0.0 |

EXAMPLES

The concepts described herein will be further described in the following Examples, which do not limit the scope of the invention described in the claims.

Example 1

Sample dielectric substrates S1-S12 were configured and formed according to certain embodiments described herein.

Each sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the

[0286] *Characteristics, including particle size distribution measurements (i.e. $D_1$, $D_5$, & $D_9$), particle size distribution span, mean particle size, and BET surface area, of the silica based component types used in the sample dielectric substrates S1-S12 are summarized in Table 2 below.*

*TABLE 2 – Silica Based Component Characteristics*

| Silica Based Component Type | $D_{10}$ (μm) | $D_{50}$ (μm) | $D_{90}$ (μm) | PSDS ($D_{90}$-$D_{10}$)/$D_{50}$ | Mean Particle Size (μm) | BET Surface Area ($m^2/g$) |
|---|---|---|---|---|---|---|
| A | 1.3 | 2.3 | 3.9 | 1.13 | 2.3-3.0 | 2.2-2.5 |
| B | 0.5 | 1.1 | 1.6 | 1.0 | 1.0-1.9 | 6.1 |

Performance properties of each sample dielectric substrates S1-S12 are summarized in Table 3 below. The summarized performance properties include the permittivity of the sample dielectric substrate measured at 5GHz ("Dk (5GHz)"), the dissipation factor of the substrate measured at 5 GHz, 20% RH ("Df (5GHz, 20% RH)"), the dissipation factor of the sample dielectric substrate measured at 5 GHz, 80% RH ("Df (5GHz, 80% RH)"), and the coefficient of thermal expansion of the sample dielectric substrate ("CTE").

TABLE 3

| | Performance Properties | | | |
|---|---|---|---|---|
| Sample No. | Dk (5 GHz) | Df (5 GHz, 20% RH) | Df (5 GHz, 80% RH) | CTE (ppm/° C.) |
| S1 | 3.02 | 0.0005 | 0.0006 | 29 |
| S2 | 3.00 | 0.0005 | 0.0007 | 28 |
| S3 | 3.02 | 0.0005 | 0.0006 | 25 |
| S4 | 2.95 | 0.0004 | 0.0006 | 20 |
| S5 | 2.76 | 0.0004 | 0.0005 | 29 |
| S6 | 2.78 | 0.0004 | 0.0005 | 19 |
| S7 | 2.73 | 0.0005 | 0.0006 | 26 |
| S8 | 2.75 | 0.0004 | 0.0006 | 31 |
| S9 | 2.78 | 0.0005 | 0.0006 | 30 |
| S10 | 2.70 | 0.0007 | 0.0010 | 34 |

TABLE 3-continued

| | Performance Properties | | | |
|---|---|---|---|---|
| Sample No. | Dk (5 GHz) | Df (5 GHz, 20% RH) | Df (5 GHz, 80% RH) | CTE (ppm/° C.) |
| S11 | 2.68 | 0.0005 | 0.0006 | 54 |
| S12 | 2.72 | 0.0004 | 0.0007 | 58 |

Example 2

For purposes of comparison, comparative sample dielectric substrates CS1-CS10 were configured and formed.

Each comparative sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each comparative sample dielectric substrates CS1-CS10 is polytetrafluoroethylene (PTFE). Further configuration and composition details of each dielectric substrate CS1-CS10 are summarized in Table 4 below.

TABLE 4

Comparative Sample Dielectric Substrate Configuration and Composition

| | | | Dielectric Substrate Composition | | | |
|---|---|---|---|---|---|---|
| Sample No. | Sample Thickness (mil) | Silica Based Component Type | Ceramic Filler Component (vol. % of dielectric substrate) | Resin Matrix Component (vol. % of dielectric substrate) | First Filler Material- Silica Based Component (vol. % of Ceramic Filler Component) | Second Ceramic Filler Material ($TiO_2$) (vol. % of Ceramic Filler Component) |
| C51 | 5 | CA | 55.0 | 45.0 | 100.0 | 0.0 |
| C52 | 5 | CB | 50.0 | 50.0 | 100.0 | 0.0 |
| C53 | 5 | CA | 50.0 | 50.0 | 100.0 | 0.0 |
| C54 | 5 | CC | 54.4 | 45.6 | 96.1 | 3.9 |
| C55 | 5 | CA | 50.0 | 50.0 | 98.0 | 2.0 |
| C56 | 5 | CA | 50.0 | 50.0 | 90.0 | 10.0 |
| C57 | 5 | CA | 52.0 | 48.0 | 96.2 | 3.8 |
| C58 | 5 | CA | 53.0 | 47.0 | 93.4 | 6.6 |
| C59 | 5 | CA | 54.0 | 46.0 | 95.9 | 4.1 |

Characteristics, including particle size distribution measurements (i.e. $D_{10}$, $D_{50}$ & $D_{90}$), particle size distribution span, mean particle size, and BET surface area, of the silica based component types used in the sample dielectric substrates CS1-CS9 are summarized in Table 2 below.

TABLE 5 – Silica Based Component Characteristics

| Silica Based Component Type | $D_{10}$ (μm) | $D_{50}$ (μm) | $D_{90}$ (μm) | PSDS ($D_{90}$-$D_{10}$)/$D_{50}$ | Mean Particle Size (μm) | BET Surface Area (m²/g) |
|---|---|---|---|---|---|---|
| CA | 4.9 | 13.9 | 30.4 | 1.83 | 16.3 | 3.3 |
| CB | 4.1 | 7.3 | 12.6 | 1.16 | 7.9 | 4.6 |
| CC | 4.6 | 6.9 | 11.1 | 0.94 | 7.5 | 2.6 |

Performance properties of each sample dielectric substrates CS1-S9 are summarized in Table 6 below. The summarized performance properties include the permittivity of the sample dielectric substrate measured at 5GHz ("Dk (5GHz)"), the dissipation factor of the substrate measured at 5 GHz, 20% RH ("Df (5GHz, 20% RH)"), the dissipation factor of the sample dielectric substrate measured at 5 GHz, 80% RH ("Df (5GHz, 80% RH)"), and the coefficient of thermal expansion of the sample dielectric substrate ("CTE").

TABLE 6

| Sample No. | Dk (5 GHz) | Df (5 GHz, 20% RH) | Df (5 GHz, 80% RH) | CTE (ppm/° C.) |
|---|---|---|---|---|
| CS1 | 2.55 | 0.0006 | 0.0009 | 25 |
| CS2 | 2.60 | 0.0008 | 0.0009 | 24 |

TABLE 6-continued

| Sample No. | Dk (5 GHz) | Df (5 GHz, 20% RH) | Df (5 GHz, 80% RH) | CTE (ppm/° C.) |
|---|---|---|---|---|
| CS3 | 2.53 | 0.0008 | 0.0018 | 31 |
| CS4 | 3.02 | 0.0005 | 0.0005 | 56 |
| CS5 | 2.64 | 0.0012 | 0.0026 | 30 |
| CS6 | 3.04 | 0.0017 | 0.0025 | 40 |
| CS7 | 2.71 | 0.0008 | 0.0013 | 36 |
| CS8 | 2.83 | 0.0015 | 0.0026 | 42 |
| CS9 | 2.82 | 0.0007 | 0.0014 | 31 |

Example 3

Sample dielectric substrates S13-S28 were configured and formed according to certain embodiments described herein.

Each sample dielectric substrate was formed using a cast film process where a fluoropolymer pre-treated polyimide carrier belt is passed through a dip pan containing an aqueous forming mixture (i.e. the combination of the resin matrix component and the ceramic filler component) at the base of the coating tower. The coated carrier belt then passes through a metering zone in which metering bars remove excess dispersion from the coated carrier belt. After the metering zone, the coated carrier belt passes into a drying zone maintained at a temperature between 82° C. and 121° C. to evaporate the water. The coated carrier belt with the dried film then passes through a bake zone maintained at a temperature between 315° C. and 343° C. Finally, the carrier belt passes through a fusing zone maintained at a temperature between 349° C. and 399° C. to sinter, i.e. coalesce, the resin matrix material. The coated carrier belt then passes through a cooling plenum from which it can be directed either to a subsequent dip pan to begin formation of a further layer of the film or to a stripping apparatus. When the desired film thickness is achieved, the films are stripped off of the carrier belt.

The resin matrix component for each sample dielectric substrates S13-S28 is polytetrafluoroethylene (PTFE). Further configuration and composition details of each dielectric substrate S13-S28, including details regarding the bonding layer type, thickness and percent, are summarized in Table 7 below.

TABLE 7

Sample Dielectric Substrate Configuration and Composition

| | | Dielectric Substrate Composition | | | | Bonding Layer | | |
|---|---|---|---|---|---|---|---|---|
| Sample No. | Sample Thickness (mil) | Ceramic Filler Component Silica Based Component Type | Ceramic Filler Component (vol. % of dielectric substrate) | Resin Matrix Component (vol. % of dielectric substrate) | First Filler Material-Silica Based Component (vol. % of Ceramic Filler Component) | Second Ceramic Filler Material (TiO₂) (vol. % of Ceramic Filler Component) | Type | Thickness (μm) | Percent (%) |
| S13 | 4 | A | 54.0 | 46.0 | 100.0 | 0.0 | PFA | 1.5 | 3.0 |
| S14 | 6 | A | 54.0 | 46.0 | 100.0 | 0.0 | PFA | 1.4 | 1.8 |
| S15 | 4 | A | 54.0 | 46.0 | 100.0 | 0.0 | PFA | 1.6 | 3.1 |
| S16 | 6 | A | 54.0 | 46.0 | 96.3 | 3.7 | PFA | — | — |

TABLE 7-continued

Sample Dielectric Substrate Configuration and Composition

| | | | Dielectric Substrate Composition | | | | | | |
|---|---|---|---|---|---|---|---|---|---|
| | | | Ceramic Filler Component (vol. % of | Resin Matrix Component (vol. % of | First Filler Material-Silica Based Component (vol. % of Ceramic | Second Ceramic Filler Material (TiO$_2$) (vol. % of Ceramic | Bonding Layer | | |
| Sample No. | Sample Thickness (mil) | Silica Based Component Type | dielectric substrate) | dielectric substrate) | Filler Component) | Filler Component) | Type | Thickness (μm) | Percent (%) |
| S17 | 4 | A | 50.0 | 50.0 | 100.0 | 0.0 | PFA | 0.5 | 1.0 |
| S18 | 4 | A | 50.0 | 50.0 | 100.0 | 0.0 | PFA | 2.4 | 4.7 |
| S19 | 4 | A | 54.0 | 46.0 | 100.0 | 0.0 | PFA | 2.8 | 5.5 |
| S20 | 6 | A | 54.0 | 46.0 | 100.0 | 0.0 | PFA | 2.7 | 3.5 |
| S21 | 6 | A | 54.0 | 46.0 | 100.0 | 0.0 | PFA | 2.5 | 3.3 |
| S22 | 4 | A | 54.0 | 46.0 | 100.0 | 0.0 | PFA | 2.0 | 3.9 |
| S23 | 4 | A | 54.0 | 46.0 | 100.0 | 0.0 | PFA | 1.5 | 3.0 |
| S24 | 4 | A | 54.0 | 46.0 | 100.0 | 0.0 | PFA | 1.6 | 3.1 |
| S25 | 6 | A | 54.0 | 46.0 | 100.0 | 0.0 | PFA | 1.6 | 2.1 |
| S26 | 4 | A | 54.0 | 46.0 | 100.0 | 0.0 | PFA | 1.8 | 3.5 |
| S27 | 4 | A | 54.0 | 46.0 | 100.0 | 0.0 | PFA | 1.0 | 2.0 |
| S28 | 6 | A | 54.0 | 46.0 | 96.3 | 3.7 | PFA | 1.0 | 1.3 |

Characteristics, including particle size distribution (measurements (i.e. $D_1$, $D_{50}$, & $D_{90}$), particle size distribution span, mean particle size, and BET surface area, of the silica based component types used in the sample dielectric substrates S13-S28 are summarized in Table 2 above.

Performance properties of each sample dielectric substrates S13-S28 are summarized in Table 8 below. The summarized performance properties include the permittivity of the sample dielectric substrate measured at 5GHz ("Dk (5GHz)"), the dissipation factor of the substrate measured at 5 GHz, 20% RH ("Df (5GHz, 20% RH)"), the dissipation factor of the sample dielectric substrate measured at 5 GHz, 80% RH ("Df (5GHz, 80% RH)"), and the coefficient of thermal expansion of the sample dielectric substrate ("CTE").

TABLE 8

Performance Properties

| Sample No. | Dk (5 GHz) | Df (5 GHz, 20% RH) | Df (5 GHz, 80% RH) | CTE (ppm/° C.) |
|---|---|---|---|---|
| S13 | 2.74 | 0.0004 | 0.0005 | 53 |
| S14 | 2.77 | 0.0005 | 0.0006 | 54 |
| S15 | 2.78 | 0.0004 | 0.0006 | 58 |
| S16 | 2.92 | 0.0006 | 0.0007 | 46 |
| S17 | 2.72 | 0.0004 | 0.0007 | 64 |
| S18 | 2.68 | 0.0005 | 0.0005 | 69 |
| S19 | 2.70 | 0.0005 | 0.0007 | 61 |
| S20 | 2.69 | 0.0005 | 0.0005 | 57 |
| S21 | 2.72 | 0.0005 | 0.0005 | 63 |
| S22 | 2.76 | 0.0005 | 0.0006 | 58 |
| S23 | 2.71 | 0.0004 | 0.0006 | 51 |
| S24 | 2.71 | 0.0004 | 0.0006 | 64 |

TABLE 8-continued

Performance Properties

| Sample No. | Dk (5 GHz) | Df (5 GHz, 20% RH) | Df (5 GHz, 80% RH) | CTE (ppm/° C.) |
|---|---|---|---|---|
| S25 | 2.73 | 0.0004 | 0.0006 | 58 |
| S26 | 2.73 | 0.0005 | 0.0006 | 61 |
| S27 | 2.72 | 0.0004 | 0.0005 | 62 |
| S28 | 2.98 | 0.0006 | 0.0007 | 52 |

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A copper-clad laminate comprising:
a copper foil layer, a fluoropolymer based adhesive layer overlying the copper foil layer, and a dielectric coating overlying the fluoropolymer based adhesive layer, wherein the dielectric coating comprises:
a resin matrix component; and
a ceramic filler component,
wherein the ceramic filler component comprises a first filler material,
wherein the dielectric coating has an average thickness of not greater than about 20 microns, and
wherein the copper-clad laminate comprises a peel strength between the copper foil layer and the dielectric coating of at least about 6 lb/in.

2. The copper-clad laminate of claim 1, wherein the fluoropolymer based adhesive layer has an average thickness of at least about 0.2 microns and not greater than about 7 microns.

3. The copper-clad laminate of claim 1, wherein the fluoropolymer based adhesive layer is a perfluoroalkoxy polymer resin layer.

4. The copper-clad laminate of claim 1, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

5. The copper-clad laminate of claim 1, wherein the first filler material comprises a silica based compound.

6. The copper-clad laminate of claim 1, wherein the first filler material comprises silica.

7. The copper-clad laminate of claim 1, wherein the resin matrix comprises a perfluoropolymer.

8. The copper-clad laminate of claim 1, wherein the content of the resin matrix component is at least about 50 vol. % and not greater than about 63 vol. % for a total volume of the dielectric coating.

9. The copper-clad laminate of claim 7, wherein the content of the perfluoropolymer is at least about 50 vol. % and not greater than about 63 vol. % for a total volume of the dielectric coating.

10. The copper-clad laminate of claim 1, wherein the content of the ceramic filler component is at least about 30 vol. % and not greater than about 57 vol. % for a total volume of the dielectric coating.

11. The copper-clad laminate of claim 1, wherein the content of the first filler material is at least about 80 vol. % and not greater than about 100 vol. % for a total volume of the ceramic filler component.

12. The copper-clad laminate of claim 1, wherein the dielectric coating comprises a dissipation factor (5 GHZ, 20% RH) of not greater than about 0.005.

13. A printed circuit board comprising a copper-clad laminate, wherein the copper-clad laminate comprises:
a copper foil layer, a fluoropolymer based adhesive layer overlying the copper foil layer, and a dielectric coating overlying the fluoropolymer based adhesive layer, wherein the dielectric coating comprises:
a resin matrix component; and
a ceramic filler component,
wherein the ceramic filler component comprises a first filler material,
wherein the dielectric coating has an average thickness of not greater than about 20 microns, and
wherein the copper-clad laminate comprises a peel strength between the copper foil layer and the dielectric coating of at least about 6 lb/in.

14. The printed circuit board of claim 13, wherein the fluoropolymer based adhesive layer is a perfluoroalkoxy polymer resin layer.

15. The printed circuit board of claim 13, wherein the first filler material comprises a particle size distribution span (PSDS) of not greater than about 5, where PSDS is equal to $(D_{90}-D_{10})/D_{50}$, where $D_{90}$ is equal to a $D_{90}$ particle size distribution measurement of the first filler material, $D_{10}$ is equal to a $D_{10}$ particle size distribution measurement of the first filler material, and $D_{50}$ is equal to a $D_{50}$ particle size distribution measurement of the first filler material.

16. The printed circuit board of claim 13, wherein the first filler material comprises a silica based compound.

17. The printed circuit board of claim 13, wherein the first filler material comprises silica.

18. The printed circuit board of claim 13, wherein the resin matrix comprises a perfluoropolymer.

19. The printed circuit board of claim 13, wherein the content of the resin matrix component is at least about 50 vol. % and not greater than about 63 vol. % for a total volume of the dielectric coating.

20. A method of forming a copper-clad laminate, wherein the method comprises:
providing a copper foil layer,
applying a fluoropolymer based adhesive layer overlying the copper foil layer,
combining a resin matrix precursor component and a ceramic filler precursor component to form a forming mixture,
forming the forming mixture into a dielectric coating overlying the fluoropolymer based adhesive layer,
wherein the dielectric coating has an average thickness of not greater than about 20 microns, and
wherein the copper-clad laminate comprises a peel strength between the copper foil layer and the dielectric coating of at least about 6 lb/in.

* * * * *